United States Patent
Inoue et al.

(10) Patent No.: US 6,878,607 B2
(45) Date of Patent: *Apr. 12, 2005

(54) THIN FILM DEVICE TRANSFER METHOD, THIN FILM DEVICE, THIN FILM INTEGRATED CIRCUIT DEVICE, ACTIVE MATRIX BOARD, LIQUID CRYSTAL DISPLAY, AND ELECTRONIC APPARATUS

(75) Inventors: Satoshi Inoue, Chino (JP); Tatsuya Shimoda, Nagano (JP); Wakao Miyazawa, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 50 days.

This patent is subject to a terminal disclaimer.

(21) Appl. No.: 10/260,791

(22) Filed: Oct. 2, 2002

(65) Prior Publication Data

US 2003/0040164 A1 Feb. 27, 2003

Related U.S. Application Data

(63) Continuation of application No. 09/242,923, filed as application No. PCT/JP98/02918 on Jun. 30, 1998, now Pat. No. 6,521,511.

(30) Foreign Application Priority Data

Jul. 3, 1997 (JP) .............................................. 9-193080

(51) Int. Cl.[7] .............................................. H01L 21/30
(52) U.S. Cl. ....................... 438/458; 438/455; 438/464; 438/149
(58) Field of Search ................................ 438/149, 155, 438/455, 458, 459, 464

(56) References Cited

U.S. PATENT DOCUMENTS 5,391,257 A 2/1995 Sullivan et al.
5,455,202 A 10/1995 Malloy et al.

(Continued)

FOREIGN PATENT DOCUMENTS

| EP | 0456199 | 11/1991 |
|----|---------|---------|
| EP | 0843344 | 5/1998 |
| EP | 0858110 | 8/1998 |

(Continued)

OTHER PUBLICATIONS

T. Sameshima, *Laser beam application to thin film transistors*, Applied Surface Science, 96–98, (1996), pp. 352–358.

Primary Examiner—Tom Thomas
Assistant Examiner—N. Drew Richards
(74) Attorney, Agent, or Firm—Oliff & Berridge PLC

(57) ABSTRACT

A thin film device fabrication method in which a thin film device formed on a substrate are transferred to a primary destination-of-transfer part and then the thin film device is transferred to a secondary destination-of-transfer part. A first separation layer (120) made of such a material as amorphous silicon is provided on a substrate (100) which allows passage of laser. A thin film device (140) such as TFTs are formed on the substrate (100). Further, a second separation layer (160) such as a hot-melt adhesive layer is formed on the thin film devices (140), and a primary destination-of-transfer part (180) is mounted thereon. The bonding strength of the first separation layer is weakened by irradiation with light, and the substrate (100) is removed. Thus, the thin film device (140) is transferred to the primary destination-of-transfer part. Then, a secondary destination-of-transfer part (200) is attached onto the bottom of an exposed part of the thin film device (140) via an adhesive layer (190). Thereafter, the bonding strength of the second separation layer is weakened by such means as thermal fusion, and the primary destination-of-transfer part is removed. In this manner, the thin film device (140) can be transferred to the secondary destination-of-transfer part (200) while maintaining layering relationship with respect to the substrate (100).

16 Claims, 23 Drawing Sheets

U.S. PATENT DOCUMENTS

| | | |
|---|---|---|
| 5,821,138 A | 10/1998 | Yamazaki et al. |
| 5,834,327 A | 11/1998 | Yamazaki et al. |
| 6,114,188 A | 9/2000 | Oliver et al. |

FOREIGN PATENT DOCUMENTS

| | | |
|---|---|---|
| JP | A-64-61943 | 3/1989 |
| JP | 03126913 | 5/1991 |
| JP | A-5-218365 | 8/1993 |
| JP | A-6-289421 | 10/1994 |
| JP | 08262475 | 10/1996 |
| JP | A-8-262475 | 10/1996 |
| JP | A-8-288522 | 11/1996 |
| JP | 10125931 | 5/1998 |

LASER BEAM

LASER BEAM

LASER BEAM

LASER BEAM

THIN FILM DEVICE TRANSFER METHOD, THIN FILM DEVICE, THIN FILM INTEGRATED CIRCUIT DEVICE, ACTIVE MATRIX BOARD, LIQUID CRYSTAL DISPLAY, AND ELECTRONIC APPARATUS

This is a Continuation of application Ser. No. 09/242,923 filed Feb. 26, 1999, U.S. Pat. No. 6,571,811 which in turn is a 371 PCT/JP98/02918 filed Jun. 30, 1998. The entire disclosure of the prior application is hereby incorporated by reference herein in its entirety.

TECHNICAL FIELD

The present invention relates to a thin film device transfer method, a thin film device, a thin film integrated circuit device, an active matrix board, a liquid crystal display, and an electronic apparatus.

BACKGROUND ART

In the manufacture of a liquid crystal display comprising thin film transistors (TFTs), for instance, thin film transistors are formed on a substrate through CVD or any other process. Since a fabrication process for forming thin film transistors on a substrate involves high-temperature treatment, a substrate made of a heat-resistant material is required, i.e., the substrate material must have a high softening point and a high melting point. At present, therefore, quartz glass is used as a material to provide a substrate capable of withstanding up to approx. 1000° C., or heat-resistant glass is used as a material to provide a substrate capable of withstanding up to approx. 500° C.

As mentioned above, the substrate on which thin film devices are to be mounted must satisfy conditions required for fabricating the thin film devices. Namely, the kind of substrate is determined to meet fabrication conditions required for the devices to be mounted thereon.

In view of a subsequent phase to be taken after thin film devices such as TFTs are formed, the substrate indicated above are not always preferable.

Where a fabrication process involving a high-temperature treatment is carried out, a quartz glass or heat-resistant glass substrate is used as exemplified above. However, the quartz glass or heat-resistant glass substrate is very expensive, resulting in an increase in product cost.

The glass substrate is also disadvantageous in that it is relatively heavy and fragile. A liquid crystal display for use in a portable electronic apparatus such as a palm-top computer or mobile telephone should be as inexpensive as possible, light in weight, resistant to deformation to a certain extent, and invulnerable to dropping. In actuality, however, the glass substrate is heavy, not resistant to deformation, and vulnerable to dropping.

In other words, there is a discrepancy between restrictive conditions required for a manufacturing process and characteristics desirable for a manufactured product. It has been extremely difficult to satisfy both of these required process conditions and desirable product characteristics.

The inventors, et al. have proposed a technique in which an object-of-transfer layer containing thin film devices is formed on a substrate through a conventional process and thereafter the object-of-transfer layer containing thin film devices is removed from the substrate for transference to a destination-of-transfer part (Japanese Patent Application No. 225643/1996). In this technique, a separation layer is formed between the substrate and a thin film device which is the object-of-transfer layer, and the separation layer is irradiated with light to cause exfoliation in an inner-layer part and/or interface of the separation layer. Thus, bonding strength between the substrate and the object-of-transfer layer is weakened to enable removal of the object-of-transfer layer from the substrate. In this manner, the object-of-transfer layer is transferred to the destination-of-transfer part. Where a fabrication process for forming thin film devices involves high-temperature treatment, a quartz glass or heat-resisting glass substrate is used. In the technique mentioned above, however, since the destination-of-transfer part is not exposed to high-temperature treatment, restrictive requirements imposed on the destination-of-transfer part are advantageously alleviated to a significant extent.

When the object-of-transfer layer containing thin film devices is removed from the substrate employed for thin film device formation so that the object-of-transfer layer is transferred to the destination-of-transfer part, the layering relationship of the object-of-transfer layer with respect to the destination-of-transfer part becomes opposite to that of the object-of-transfer layer with respect to the substrate. Namely, the side of the object-of-transfer layer which has faced the substrate originally does not face the destination-of-transfer part. For example, in the case where the object-of-transfer layer has first and second layers and is formed on the substrate in the order of the first and second layers, when the object-of-transfer layer is transferred to the destination-of-transfer part, the object-of-transfer layer is configured thereon in the order of the second and first sub-layers.

In the common practice of forming thin film devices on a substrate, electrodes are formed via an insulation layer after the formation of the element. Since the electrodes are disposed on the surface side, wiring connections or contacts can be arranged on the electrodes with ease. On the contrary, where the object-of-transfer layer containing thin film device and electrodes is transferred to the destination-of-transfer part, the electrodes are covered with the destination-of-transfer part, making it difficult to arrange wiring connections or contacts thereon.

DISCLOSURE OF THE INVENTION

In view of the foregoing, it is a general object of the present invention to provide a novel technique in which a substrate employed for thin film device formation and a substrate used as an actual element of a product (i.e., a substrate having characteristics desirable for usage of the product) can be selected individually and flexibly and in which thin film devices can be transferred to the substrate used as the actual product element while maintaining the layering relationship of the thin film devices with respect to the substrate employed for thin film device formation.

In accomplishing this object of the present invention and according to one aspect thereof, there is provided a thin film device transfer method comprising:

a first step of forming a first separation layer on a substrate;

a second step of forming an object-of-transfer layer containing a thin film device on the first separation layer;

a third step of forming a second separation layer on the object-of-transfer layer;

a fourth step of attaching a primary destination-of-transfer part to the second separation layer;

a fifth step of removing the substrate from the object-of-transfer layer using the first separation layer as a boundary;

a sixth step of attaching a secondary destination-of-transfer part to the bottom of the object-of-transfer layer; and a seventh step of removing the primary destination-of-transfer part from the object-of-transfer layer using the second separation layer as a boundary, whereby the object-of-transfer layer containing the thin film device is transferred to the secondary destination-of-transfer part.

The first separation layer to be separated later is provided on a substrate such as a quartz glass substrate having high reliability for device fabrication, and the object-of-transfer layer containing thin film devices such as TFTs is formed thereon. Then, the second separation layer to be separated later is formed on the object-of-transfer layer, and further the primary destination-of-transfer part is attached to the second separation layer. Thereafter, using the first separation layer as a boundary, the substrate employed for thin film device formation is removed from the object-of-transfer layer. In this state, however, layering relationship of the object-of-transfer layer with respect to the primary destination-of-transfer part is opposite to that of the object-of-transfer layer with respect to the substrate employed for thin film device formation.

It is therefore preferable that the first separation layer is removed from the bottom of the object-of-transfer layer, then the secondary destination-of-transfer part is attached to the bottom thereof. Thereafter, using the second separation layer as a boundary, the primary destination-of-transfer part is removed from the object-of-transfer layer. Thus, the secondary destination-of-transfer part is disposed at the position that has been occupied by the substrate employed for thin film device formation. i.e., the layering relationship of the object-of-transfer layer with respect to the secondary destination-of-transfer part agrees with that of the object-of-transfer layer with respect to the substrate employed for thin film device formation.

The step of attaching the secondary destination-of-transfer part to the bottom of the object-of-transfer layer and the step of removing the primary destination-of-transfer part from the object-of-transfer layer may be reversed; namely, either of these steps may be carried out first. In a situation where a problem may occur in handling the object-of-transfer layer after removing the primary destination-of-transfer part, however, it is desirable to attach the object-of-transfer layer to the secondary destination-of-transfer part first and then remove the primary destination-of-transfer part from the object-of-transfer layer. In this respect, the primary destination-of-transfer part may be made of any material having at least a shape-retaining property. Since the primary destination-of-transfer part is not used in thin film device formation, it is not required to consider restrictive process conditions such as heat resistance and metallic contamination.

In the fifth step, it is preferable to include a step of irradiating the first separation layer with light to cause exfoliation in an inner-layer and/or interface of the first separation layer.

The first separation layer is irradiated with light, thereby causing a phenomenon of exfoliation in the first separation layer. This decreases adhesiveness between the first separation layer and the substrate. Then, by applying force to the substrate, the substrate can be removed from the object-of-transfer layer.

The substrate preferably transmits light. In this case, the first separation layer is irradiated with light through the light transmitting substrate.

Thus, without directly irradiating the thin film devices with light, exfoliation can be made to occur in the first separation layer, thereby reducing the possibility of degradation in the performance characteristic of the thin film devices.

Further, the second separation layer may be made of an adhesive material. In this case, the fifth step includes a step of melting the adhesive material.

Where the second separation layer made of an adhesive material is employed, it is also usable as an adhesive for attaching the primary destination-of-transfer part later. Still more, after the primary destination-of-transfer part is attached, it can be removed easily by heating. Still further, even in case there is some unevenness on the surface of the object-of-transfer layer containing thin film devices, the adhesive material can be used as a flattening layer to compensate for the unevenness, thus making it easy to attach the primary destination-of-transfer part to the second separation layer.

In the seventh step, it is preferable to include a step of irradiating the second separation layer with light to cause exfoliation in an inner-layer part and/or interface of the second separation layer.

The second separation layer is irradiated with light, thereby causing a phenomenon of exfoliation in the second separation layer. This decreases adhesiveness between the second separation layer and the primary destination-of-transfer part. Then, by applying force, the primary destination-of-transfer part can be removed from the object-of-transfer layer.

The primary destination-of-transfer part preferably transmit light. In this case, the second separation layer is irradiated with light through the light transmitting primary destination-of-transfer part.

Thus, without directly irradiating the thin film devices, exfoliation can be lade to occur in the second separation layer, thereby reducing the possibility of degradation in the performance characteristics of the thin film devices.

In the second step, it is preferable to include a step of forming an electrode for conduction to the thin film device after formation of the thin film device. In this case, the secondary destination-of-transfer part, thin film devices, and electrodes are superimposed in the order mentioned. Even after the object-of-transfer layer is transferred to the secondary destination-of-transfer part, wiring connections or contacts can be arranged on the electrodes with ease.

Further, it is preferable to provide a step of removing the second separation layer from the object-of-transfer layer. In this step, the second separation layer, which is unnecessary, is removed completely.

Referring particularly to preferable properties of a material of the secondary destination-of-transfer part, the secondary destination-of-transfer part is not used in thin film device formation as in the case of the primary destination-of-transfer part. Therefore, in selection of a material for the secondary destination-of-transfer part, it is not required to consider restrictive process conditions such a heat resistance and metallic contamination.

The secondary destination-of-transfer part may be a transparent substrate. An inexpensive soda class substrate or a flexible transparent plastic film may be considered as the transparent substrate. Where a transparent substrate is used as the secondary destination-of-transfer part, it is possible to realize a liquid crystal panel substrate having thin film devices formed thereon, for example.

Assuming that a maximum temperature in the formation of the object-of-transfer layer is $T_{max}$, the secondary destination-of-transfer part is preferably made of a material having a glass transition temperature (Tg) or softening point lower than or equal to the $T_{max}$.

Thus, it becomes possible to flexibly use an inexpensive glass substrate which has not been applicable conventionally because of insufficient resistance to the maximum temperature in device formation. Similarly, the primary destination-of-transfer part is not required to have resistance to heat as high as the maximum temperature level in the process of thin film device formation.

The glass transition temperature (Tg) or softening point of the secondary destination-of-transfer part may be lower than or equal to the maximum temperature in the process of thin film device formation since the secondary destination-of-transfer part is not exposed to the maximum temperature of thin film device formation. The secondary destination-of-transfer part may therefore be made of a synthetic resin or glass material.

For instance, if a flexible synthetic resin sheet such as a plastic film is used as the secondary destination-of-transfer part and the thin film devices are transferred thereto, it is possible to provide an advantageous characteristic which would not be attained with a highly rigid glass substrate. By applying the present invention to liquid crystal display manufacturing, a display device which is flexible, lightweight and invulnerable to dropping can be realized.

Further, for instance, an inexpensive soda glass substrate is also usable as the secondary destination-of-transfer part. The inexpensive soda glass substrate is advantageous in lowering the manufacturing cost. Since the soda glass substrate gives rise to a problem that alkaline components thereof are eluted through heat treatment in TFT fabrication, it has been difficult conventionally to use the soda glass substrate in manufacturing an active matrix liquid crystal display. In the present invention, however, since the thin film devices already completed are transferred to the secondary destination-of-transfer part, the problem concerning heat treatment does not take place. It is therefore possible to use the soda glass substrate or the like having such a problem as mentioned above in a field of an active matrix liquid crystal display.

Then, referring particularly to properties of a material of the substrate on which the object-of-transfer layer is formed, it is preferable for the substrate to provide heat resistance. In thin film device formation, heat treatment at a desired temperature can thus be carried out to enable fabricating high-performance thin film devices with high reliability.

Furthermore, the substrate mentioned above preferably allows transmission of 10% or more of light to be used for exfoliation thereof. A sufficient amount of light energy for exfoliation in the first separation layer can thus be transmitted through the substrate.

Assuming that a maximum temperature in formation of the object-of-transfer layer is $T_{max}$, the substrate is preferably made of a material having a distortion point higher than or equal to the $T_{max}$.

Thus, it becomes possible to carry out heat treatment at a desired temperature in thin film device formation for fabricating high-performance thin film devices with high reliability.

Then, referring to preferable properties of a material of the first separation layer and/or second separation layer in which exfoliation is made to occur by irradiation with light, the first separation layer and/or second separation layer are preferably made of amorphous silicon.

Amorphous silicon absorbs light, and it is rather easy to manufacture and highly practicable to use.

Further, it is preferable to use amorphous silicon which contains 2 atomic % or more of hydrogen (H).

Where amorphous silicon containing hydrogen is used, irradiation with light causes release of hydrogen, thereby producing internal pressure in the separation layer. Thus, an action for promoting exfoliation in the separation layer takes place.

Amorphous silicon containing 10 atomic % or more of hydrogen (H) may also be used.

An increase in percentage content of hydrogen increases the degree of action for promoting exfoliation in the separation layer.

As another kind of material for the first separation layer and/or second separation layer in which exfoliation is made to occur by irradiation with light, silicon nitride may be used.

Further, as another kind of material for the first separation layer and/or second separation layer in which exfoliation is made to occur by irradiation with light, a hydrogen-containing alloy may be used.

Where a hydrogen-containing alloy is used as a material for the separation layer, irradiation with light causes release of hydrogen, thereby promoting exfoliation in the separation layer.

Still further, as another kind of material of the first separation layer and/or second separation layer in which exfoliation is made to occur by irradiation with light, nitrogen-contained alloy may be used.

Where a nitrogen-containing alloy is used as a material of the separation layer, irradiation with light causes release of nitrogen, thereby promoting exfoliation in the separation layer.

The separation layer may be a single-layer film or a multi-layer film which comprises an amorphous silicon layer and a metallic layer formed thereon.

As another kind of material of the first separation layer and/or second separation layer in which exfoliation is made to occur by irradiation with light, any material including at least one of the following components may be used; ceramic, metal, and high polymer.

These substances are indicated here as representative groups that are applicable in practice as the first separation layer and/or second separation layer in which exfoliation is made to occur by irradiation with light. For example, a hydrogen-containing alloy or nitrogen-containing alloy may be selected from the group of metallic materials. In the case where a hydrogen-containing alloy or nitrogen-containing alloy is used, exfoliation in the separation layer is promoted by release of hydrogen gas or nitrogen gas due to irradiation with light similar to amorphous silicon.

The light used in the irradiation step is preferably a laser beam.

A laser beam has a coherent property, and is suitable for causing exfoliation in the first separation layer and/or second separation layer.

It is possible to use a laser beam having a wavelength of 100 nm to 350 nm.

The use of laser energy light having a short wavelength enables efficient exfoliation in the first separation layer and/or second separation layer.

As an example of a laser beam meeting the requirement mentioned above, excimer laser is preferable. An excimer laser is a kind of gas laser which is capable of outputting a high-energy laser beam having a short wavelength in the ultraviolet region. A combination of rare gas (Ar, Kr, Xe) and halogen gas ($F_2$, HCl) is used as a laser medium to produce laser beam energy at each of four wavelengths (XeF=351 nm, XeCl=308 nm, Krf=248 nm, ArF=193 nm).

In the first separation layer and/or second separation layer, irradiation with an excimer laser causes direct disconnection of molecular bonding, gaseous evaporation, etc. without a thermal effect.

A laser wavelength ranging from 350 nm to 1200 nm may be adopted.

For inducing separation by such a phase change action as release of gas, vaporization or sublimation in the first separation layer and/or second separation layer, a laser beam having a wavelength of 350 nm to 1200 nm is applicable.

The thin film device mentioned above may be thin film transistor (TFT). Thus, high-performance TFT can be transferred (formed) arbitrarily onto a desired kind of secondary destination-of-transfer part. In this manner, a variety of electronic circuits can be mounted on the destination-of-transfer part.

The transfer process according to the present invention may be carried out repetitively on the secondary destination-of-transfer part which is larger than each substrate mentioned above. Thus, a plurality of object-of-transfer layers can be transferred to the secondary destination-of-transfer part.

A large-sized circuit panel comprising highly reliable thin film devices can be produced by carrying out thin film device pattern transference a plural number of times using a highly reliable substrate repetitively or using a plurality of substrates.

By carrying out the transfer process of the present invention repetitively on the secondary destination-of-transfer part which is larger than the abovementioned substrate, a plurality of object-of-transfer layers, each having different design rule levels, may be transferred to the secondary destination-of-transfer part in a single-sheet form.

For instance, where a plurality of circuits of different kinds (including functional blocks) are to be mounted on a single substrate, elements and wiring lines in these circuits may differ in size (i.e. so called design rule) according to the required characteristics. In such a case, by carrying out transference of each circuit using the transfer method of the present invention, a plurality of circuits, each having different design rule levels, can be formed on the secondary destination-of-transfer part in a single-sheet form.

Using the transfer method of the present invention, thin film devices or thin film integrated circuit devices may be configured on the secondary destination-of-transfer part through transfer processing. For example, a single-chip microcomputer comprising thin film transistor (TFT) can be mounted on a synthetic resin substrate.

According to the present invention, it is possible to form an active matrix board comprising a pixel portion which includes thin film transistors (TFTs) arranged in a matrix and pixel electrodes connected with respective ends of the thin film transistors, wherein the method defined in any one of claims 1 to 16 is used in transferring the thin film transistors of the pixel portion for fabrication of the active matrix board. In this case, using the transfer method of the present invention, the thin film transistors for the pixel portion are transferred to the secondary destination-of-transfer part to produce an active matrix board. Thus, since an arbitrary kind of substrate (secondary destination-of-transfer part) is selectable without consideration of restrictive manufactur ing process conditions, a novel type of active matrix board may be realized.

According to the present invention, it is possible to produce an active matrix board which comprises thin film transistors serving as the pixel portion corresponding to a first design rule level and thin film transistors serving as driver circuits corresponding to a second design rule level. Both the pixel portion and driver circuits can thus be mounted on the active matrix board. However, the design rule levels of the pixel portion and driver circuits differ from each other. For example, a degree of circuit integration can be increased by forming a driver circuit thin film pattern using mono-crystal silicon transistor fabrication equipment, for example.

Through use of the technique mentioned above, a liquid crystal display device can be manufactured. For example, it is possible to realize a liquid crystal display comprising a plastic substrate, which can be curved flexibly.

Using the transfer method of the present invention, an electronic apparatus having thin film devices transferred to a secondary destination-of-transfer part may be produced. In this application of the present invention, as the secondary destination-of-transfer part, a casing part of the apparatus may be adapted so that the thin film devices will be transferred on at least either the inside or the outside of the casing part.

According to another aspect of the present invention, there as provided a thin film device transfer method, comprising:

a first step of forming a first separation layer on a substrate;

a second step of forming an object-of-transfer layer containing a thin film device on the first separation layer;

a third step of removing the substrate from the object-of-transfer layer using the first separation layer as a boundary; and a fourth step of attaching a destination-of-transfer part to the bottom of the object-of-transfer layer, whereby the object-of-transfer layer containing the thin film device is transferred to the destination-of-transfer part.

In the manner mentioned above, transference of the object-of-transfer layer can accomplished using the separation layer and the destination-of-transfer part instead of combined use of first and second separation layers and primary and secondary destination-of-transfer parts. This method is practicable if the object-of-transfer layer itself has a shape retaining property. Because, under the condition where the object-of-transfer layer is capable of retaining a shape thereof, it is not required to support the object-of-transfer layer with the primary destination-of-transfer part. In this case, the object-of-transfer layer may be provided with a reinforcing layer as well as a thin film device layer.

BEST MODE FOR CARRYING OUT THE INVENTION

The present invention will now be described in detail by way of example with reference to the accompanying drawings.

First Embodiment

FIGS. 1 to 9 are diagrammatic illustrations for explaining a first embodiment (thin film device transfer method) according to the present invention.

[Step 1]

Figure 1:
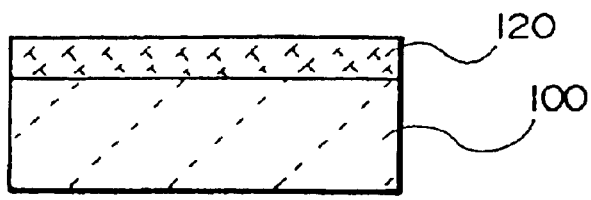
FIG. 1 is a sectional view showing a first step in a first embodiment of a thin film device transfer method according to the present invention.

An shown in FIG. 1, a first separation layer (light absorbing layer) 120 is formed on a substrate 100. The following describes the substrate 100 and the first separation layer 120.

(1) Description of Substrate 100

The substrate 100 preferably has a property that allows transmission of light therethrough. Transmittance of light passing though the substrate 100 is preferably 10% or higher, and more preferably 50% or higher. If the transmittance is too low, attenuation (loss) of light increases to make it necessary to apply a larger amount of light for exfoliating the first separation layer.

Further, the substrate 100 is preferably made of a highly reliable material. More particularly, it is preferable that the substrate 100 be made of a heat-resisting material. The reason for this requirement is as follows: For instance, in the formation of an object-of-transfer layer 140 or an intermediate layer 142 to be described later, the process temperature may be increased (e.g., approx. 350 to 1000° C.) depending on the kind of layer or method of formation. Even in such a case, if the substrate 100 is resistant to heat, it is possible to widen a Letup range of film forming conditions such as the temperature in the formation of the object-of-transfer layer 140 on the substrate 100.

Therefore, assuming that the maximum temperature in the formation of the object-of-transfer layer 140 is $T_{max}$, the substrate 100 is preferably made of a material having a distortion point higher than the $T_{max}$. To be more specific, the distortion point of the material of the substrate 100 is preferably 350° C. or higher, and more preferably 500° C. or higher. For example, quartz glass and heat-resisting glass sold under the trade names Corning 7059 and Nihon Denki Glass OA-2 are included in this kind of material.

Although the thickness of the substrate 100 is not limited in particular, it is preferably approx. 0.1 to 5.0 mm and more preferably approx. 0.5 to 1.5 mm in common application. If the substrate 100 is too thin, the strength thereof is decreased. On the contrary, if the substrate 100 is too thick, the transmittance thereof in decreased to make significant attenuation of light prone to occur. In the came where the substrate 100 has relatively high transmittance, the thickness thereof may exceed the limit value indicated above. In addition, the substrate 100 preferably has a uniform thickness so that irradiation with light will be applied evenly.

(2) Description of First Separation Layer 120

The first separation layer 120 has a property whereby light irradiation is absorbed to cause exfoliation in an inner-layer part and/or interface thereof (hereinafter referred to as "inner-layer exfoliation" or "interface exfoliation"). The first separation layer 120 is preferably made of such a material that interatomic or intermolecular bonding strength of component substances thereof will be eliminated or reduced by irradiation with light, causing inner-layer exfoliation and/or interface exfoliation through abrasion.

Further, by irradiation with light, gas may be released from the first separation layer 120 to develop a separation effect. Namely, components contained in the first separation layer 120 may be released as gas, or light absorption by the first separation layer 120 may change its components into gas momentarily to release vapor thereof, contributing to separation. For example, the following substances A to E are applicable as components of the first separation layer 120:

A. Amorphous Silicon (a-Si):

Amorphous silicon may contain hydrogen (H). In this case, the content of hydrogen (H) is preferably approx. 2 atomic % or more, and more preferably approx. 2 to 20 atomic %. Where amorphous silicon contains hydrogen (H) as indicated above, irradiation with light causes release of hydrogen, thereby producing internal pressure in the first separation layer 120. The internal pressure thus produced acts as a force for exfoliation on the top and bottom surfaces of the first separation layer 120. The quantity of hydrogen (H) contained in amorphous silicon can be properly adjusted by chancing film forming conditions such as CVD gas composition, gas pressure, gas atmosphere, gas flow rate, temperature, substrate temperature, and input power.

B. Ceramic Oxide, Dielectric (Ferroelectric) or Semiconductor Substances Containing Various Oxides such as Silicon Oxide or Silicon Oxide Compound, Titanium Oxide or Titanium Oxide Compound, Zirconium Oxide or Zirconium Oxide Compound, and Lanthanum Oxide or Lanthanum Oxide Compound:

silicon oxide substances include SiO, $SiO_2$ and $Si_3O_2$, and silicon oxide compounds include $K_2SiO_2$, $Li_2SiO_3$, $CaSiO_2$, $ZrSiO_4$ and $Na_2SiO_3$, for example.

Titanium oxide substances include TiO, $Ti_2O_3$ and $TiO_2$, and titanium oxide compounds include $BaTiO_4$, $BaTiO_3$, $Ba_2Ti_9O_{20}$, $BaTi_5O_{11}$, $CaTiO_3$, $SrTiO_3$, $PbTiO_3$, $MgTiO_3$, $ZrTiO_2$, $SnTiO_4$, $Al_2TiO_5$, and $FeTiO_3$, for example.

Zirconium oxide substances include $ZrO_2$, and zirconium oxide compounds include $BaZrO_3$, $ZrSiO_4$, $PbZrO_3$, $MgZrO_3$ and $K_2ZrO_3$, for example.

C. Ceramic or Dielectric (Ferroelectric) Substances such as PZT, PLZT, PLLZT and PBZT:

D. Ceramic Nitride Substances such as Silicon Nitride, Aluminum Nitride and Titanium Nitride:

E. Organic High Polymer Materials:

Organic high polymer materials having such bondings as —CH—, —CO— (ketone), —CONH— (amde), —NH— (imide), —COO— (ester), —N=N— (azo) and —CH=N—(cis) (bondings disconnectable by irradiation with light) are applicable. In particular, any organic high polymer material having a multiplicity of these bondings may be used. Further, organic high polymer materials which have a chemical composition including aromatic hydrocarbon (one or more benzene rings or condensed rings thereof) may be used.

Listed below are concrete examples of these kinds of organic high polymer materials; polyolefine such as polyethylene and polypropylene, polyimide, polyamide, polyester, polymethylmethacrylate (PMA), polyphenylene sulfide (PPs), polyethersulphone (PEs), epoxy resin, etc.

F. Metals:

For example, the following metallic substances are applicable; Al, Li, Ti, Mn, In, Sn, Y, La, Ce, Nd, Pr, Gd, Sm, and any alloy containing at least one of these metals.

Though depending on the exfoliation conditions, composition and structure of the first separation layer 120, layer form method and other conditions, the thickness of the first separation layer 120 in common application is preferably approx. 1 nm to 20 $\mu$m, more preferably approx. 10 nm to 2 $\mu$m, and most preferably approx. 40 nm to 1 $\mu$m. If the first separation layer 120 is too thin, uniformity in film formation may be impaired to cause unevenness in exfoliation. On the contrary, if the first separation layer 120 is too thick, the power (amount) of light must be increased to ensure satisfactory exfoliation thereof. In this case, when the first separation layer 120 is later removed, more time may also be required for removal. It is preferable that the thickness of the first separation layer 120 be uniform insofar as possible.

A method of forming the first separation layer 120 is not specified in particular, and it is properly selectable according to the conditions such as film formation, film thickness. For example, the following methods are applicable; vapor-phase film formation methods such as CVD (including MOCVD, low-pressure CVD, ECR-CVD) evaporation, molecular beam evaporation (MB) sputtering, ion plating and PVD, plating methods such as electroplating, immersion plating (dipping) and electroless plating, Langmuir-Blodgett (LB) method, coat application methods such as spin coating, spray coating and roll coating, printing method, transfer method, ink jet method, powder jet method, etc. Two or more of these methods may be combined for film formation.

In the case, where the first separation layer 120 is made of amorphous silicon (a-Si), it is preferred that film formation be carried out using a CVD method, in particular, as low-pressure CVD or plasma CVD.

When the first separation layer 120 is made of ceramic using a sol-gel method or made of an organic high polymer material, it is preferred that film formation be carried out using a coat application method such as spin coating.

[Step 2]

Figure 2:
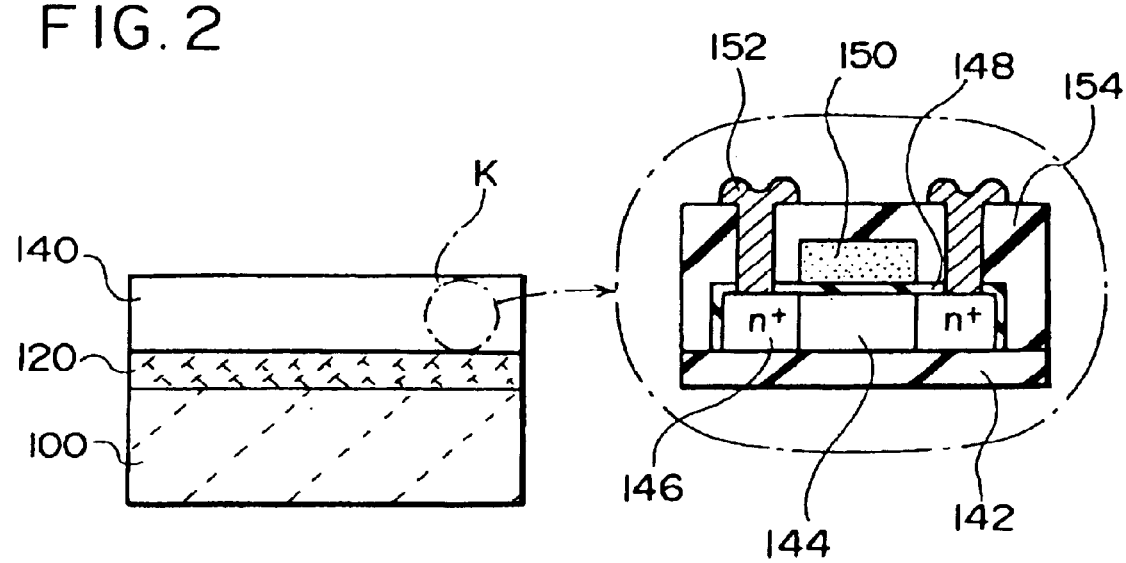
FIG. 2 is a sectional view showing a second step in the first embodiment of the thin film device transfer method according to the present invention.

After completion of the step 1, an object-of-transfer layer (thin film device layer) 140 is formed on the first separation layer 120 as shown in FIG. 2.

Illustrated on the right side of FIG. 2 is an enlarged sectional view of a part x of the thin film device layer 140 (enclosed by the chain line in FIG. 2). As indicated in this figure, the thin film device layer 340 is structured to include TFTs (thin film transistors) formed on an $SiO_2$ film (intermediate layer) 142, for example. The TFT comprises a source-drain layer 146 formed by introducing an n-type impurity into a polysilicon layer, a channel layer 144, a gate insulation film 14B, a gate electrode 150, an inter-layer insulation film 154, and an electrode 152 made of a material such as aluminum.

In the present preferred embodiment, the $SiO_2$ film is used as an intermediate layer arranged in contact with the first separation layer 120. Instead, other kinds of insulation films, such as $Si_3N_4$ may be used. The thickness of the $SiO_2$ film (intermediate layer) may be properly determined according to the purposes of formation and decree of functional performance to be achieved. In common application, this is preferably approx. 10 nm to 5 $\mu$m, and more preferably approx. 40 nm to 1 $\mu$m. The intermediate layer is formed for various purposes. e.g., it is provided to serve as at least any one of the following layers; a protective layer for physically or chemically protecting the object-of-transfer layer 140, an insulation layer, a conductive layer, a laser shielding layer, a barrier layer for preventing migration, and a reflective layer.

In some cases, the intermediate layer such as $SiO_2$ film may not be provided and the object-of-transfer layer (thin film device layer) 140 may be formed directly on the first separation layer 120.

The object-of-transfer layer (thin film device layer) 140 is formed as a layer containing thin film devices such as TFTs as shown on the right of FIG. 2.

Besides TFTS, the thin film devices include; thin film diodes, photoelectric transfer component comprising silicon PIN junction (photosensors, solar cells), silicon resistor element, other thin film semiconductor devices, electrodes (e.g., ITO, transparent electrodes such as mesa films), switching element, memory, actuators such as piezoelectric devices, micro mirrors (piezoelectric thin film ceramics), magnetic recording thin film head, coils, inductors, thin film highly-permeable material and micro magnetic devices comprising a combination thereof, filter, reflection films, dichroic mirrors, etc. In addition to these examples, a variety of thin film devices are applicable unless departing from the concept of the present invention.

It is common practice to form these thin film devices through a step for a film formation method using a relatively high temperature. In such a case, the substrate 100 must therefore have high reliability to withstand a high steping temperature, as mentioned in the foregoing description.

[Step 3]

Figure 3:
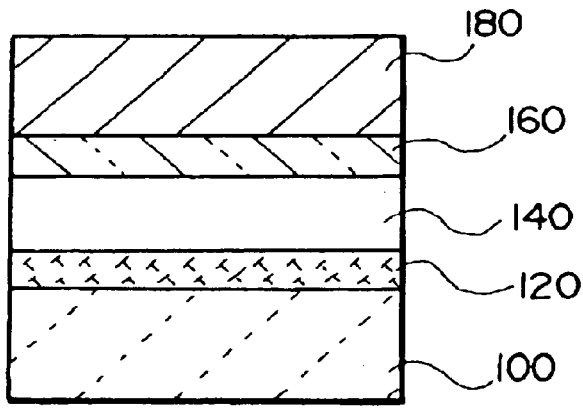
FIG. 3 is a sectional view showing a third step in the first embodiment of the thin film device transfer method according to the present invention.

Then, referring to FIG. 3, a hot-melt adhesive layer 160 is formed an a second separation layer on the thin film device layer 140, for example. Instead of the hot-melt adhesive layer 160, a water-soluble adhesive material or an adhesive material fusible to a specific organic solvent may be used. Further, the second separation layer may be formed to provide an abrasion layer as in the case of the first separation layer.

As an example of a material for the hot-melt adhesive layer 160, electron wax such as "Proof Wax" (trade name) may be used for minimizing possible contamination with impurities (sodium, potassium, etc.) on the thin film devices.

[Step 4]

Then, as shown in FIG. 3, a primary destination-of-transfer part 180 is attached onto the hot-melt adhesive layer 160 which is the second separation layer. Since the primary destination-of-transfer part 180 is attached after fabrication of the thin film device layer 140, restrictive conditions such as a process temperature level required for fabrication of the thin film device layer 140 are not imposed. The primary destination-of-transfer part 180 must merely have a shape retaining property at ordinary temperatures. In the present preferred embodiment, a relatively inexpensive material having a shape retaining property such as a glass substrate material or synthetic resin material is employed. For the primary destination-of-transfer part 180, the same material as for a secondary destination-of-transfer part 200 may be used.

[Step 5]

Figure 4:
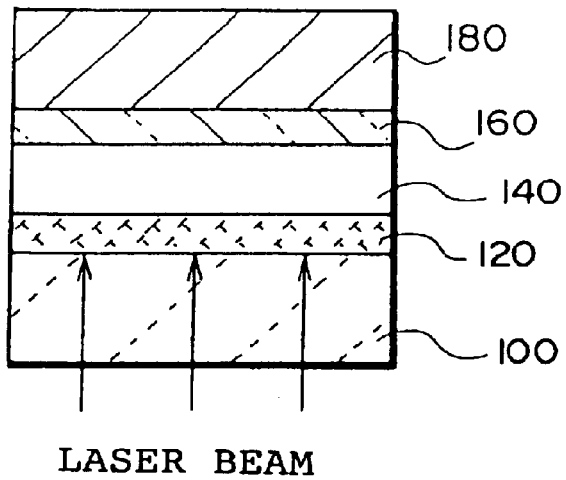
FIG. 4 is a sectional view showing a fourth step of the first embodiment of the thin film device transfer method according to the present invention.

As shown in FIG. 4, the back side of the substrate 100 is irradiated with light.

After passing through the substrate 100, the light is applied to the first separation layer 120. This causes inner-layer exfoliation and/or interface exfoliation in the first separation layer 120, reducing or eliminating the bonding strength thereof.

It is presumed that occurrence of inner-layer exfoliation and/or interface exfoliation in the first separation layer 120 is due to the following phenomena; abrasion in a component material of the first separation layer 120, release of gas contained in the first separation layer 120 and fusion induced immediately after irradiation, and phase change such as transpiration.

The phenomenon of abrasion mentioned here means a condition whereby a fixative (component material of the first separation layer 120) is photochemically or thermally excited by absorbing light so that the bandings of atoms or molecules on the surface of the first separation layer 120 or in the inside thereof are disconnected to cause release of atoms or molecules. In most cases, a change of phase such as fusion or transpiration (vaporization) takes place entirely or partially in the component material of the first separation layer 120. Further, such a change of phase may cause a micro-foaming state to decrease the bonding strength.

Whether inner-layer exfoliation, interface foliation or both of them occur in the first separation layer 120 depends on the composition of the first separation layer 120 and other various causes. Included in these causes are such conditions as kind, wavelength, intensity and penetration depth of light applied for irradiation.

Any kind of light is applicable for irradiation as long as it can cause inner-layer exfoliation and/or interface exfoliation in the first separation layer 120. For example, the following kinds of light may be used; x rays, ultraviolet rays, visible rays, infrared rays (heat rays), laser, milli waves, microwaves, electron beam, and radioactive rays (alpha rays, beta rays, gamma rays). Among them, the laser is advantageous in that it can cause exfoliation (abrasion) readily in the first separation layer 120.

There are various kinds of gas laser equipment and solid-state laser (semiconductor laser) equipment which may be used for generating laser beams for irradiation. An excimer laser, Nd—YAG laser, Ar laser, $CO_2$ laser, CO laser and He—Ne laser are suitable, and, of these, the excimer laser is particularly preferable.

Since the excimer laser is capable of outputting high energy in the short wavelength range, it can cause abrasion in the first separation layer 120 in a fraction of time. It is therefore possible to exfoliate the first separation layer 120 while scarcely increasing the temperature of the destination-of-transfer part 180 and the substrate 100, i.e., without incurring deterioration or damage thereon.

Further, in the case where the first separation layer 120 is dependent on the light wavelength for abrasion to occur, the wavelength of the laser to be applied for irradiation is preferably approx. 100 nm to 350 nm.

Figure 10:
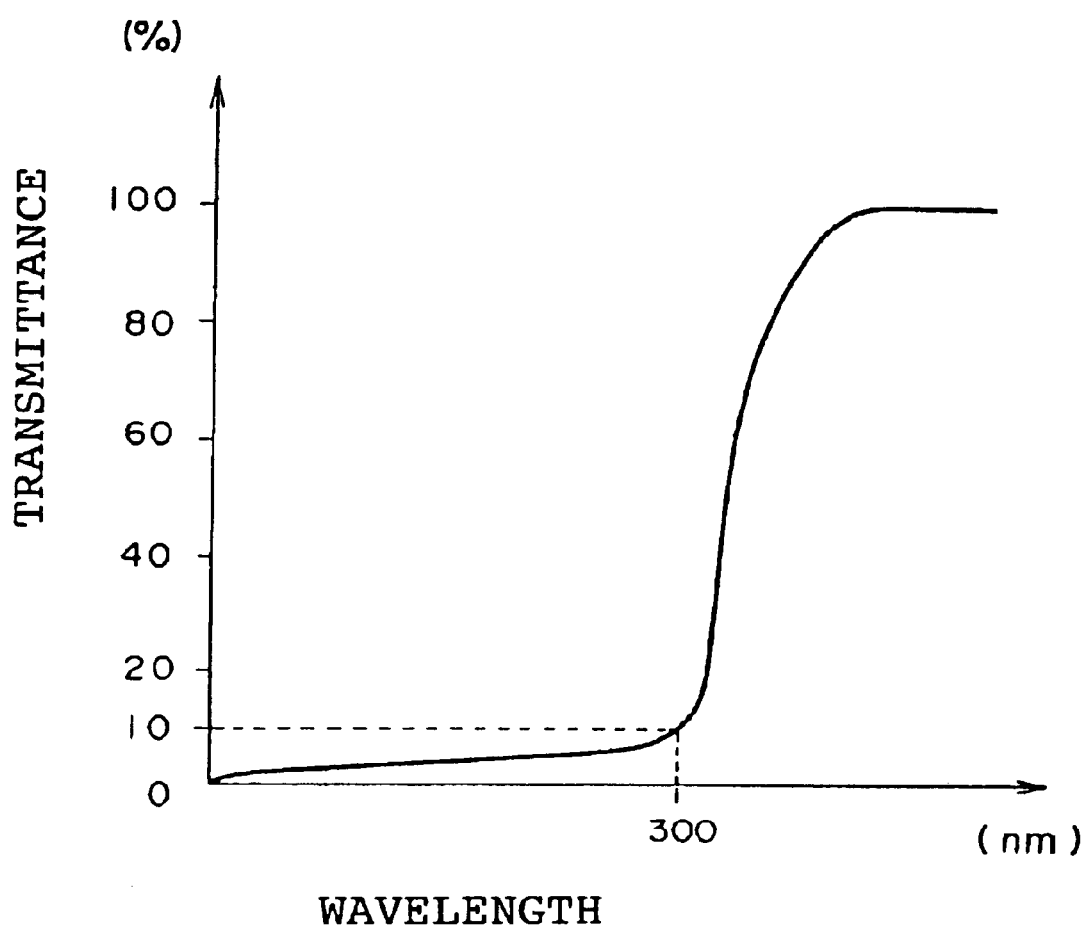
FIG. 10 is a graph showing variations in transmittance of laser wavelength to a first substrate (substrate 100 indicated in FIG. 1)

FIG. 10 shows an example of transmittance of light wavelength to the substrate 100. As exemplified in the figure, transmittance increases abruptly at a wavelength of 300 nm. In such a case, light having a wavelength of 300 nm or more (e.g., an Xe—Cl excimer laser beam having a wavelength of 308 nm) is applied for irradiation.

When release of gas, vaporization, sublimation or any other chance of phase is made to occur in the first separation layer 120 for exfoliation, the wavelength of the laser beam applied for irradiation is preferably approx. 350 to 1200 nm.

Further, the energy density of the laser beam applied for irradiation, in the case of an excimer laser in particular, is preferably approx. 10 to 5000 mJ/cm$^2$ and more preferably approx. 100 to 500 mJ/cm$^2$. The irradiation time is preferably approx. 1 to 1000 nsec and more preferably approx. 10 to 100 nsec. If the energy density is too low or the irradiation time is too short, abrasion does not occur to a sufficient extent. On the contrary, if the energy density is too high or the irradiation time is too long, the laser beam passing through the first separation layer 120 way have an adverse effect on the object-of-transfer layer 140.

To prevent an adverse effect from the light penetrating to the object-of-transfer layer 140 through the first separation layer 120, a method of forming a film made of metal such as tantalum (Ta) on the first separation layer 120 (laser absorbing layer) may be employed for example. Thus, the laser beam passing through the first separation layer 120 is completely reflected by a metallic film (not shown) serving as an interface, thereby avoiding an adverse effect on the thin film device layer covered therewith. There may also be provided an arrangement whereby an amorphous silicon layer for absorbing laser beams is formed on the first separation layer 120 via a silicon intervention layer made of a substance, such as $SiO_2$. Thus, laser beams transmitted though the first separation layer 120 are absorbed by the amorphous silicon layer formed thereon. Note, however, that the transmitted laser does not have a level of light energy as sufficient to cause abrasion in the amorpious silicon layer. Unlike a metallic layer, the amorphous silicon layer allows formation of a thin film device layer thereon. It is therefore possible to form a high-quality thin film device layer using an already established thin film forming technique.

Light for irradiation, represented by laser beams, is preferably applied so that its intensity will be uniform. The irradiating direction of the light may be perpendicular to the first separation layer 120 or inclined at a predetermined angle thereto.

If the area of the first separation layer 120 is larger than the irradiation spot by a single light irradiation, the light beam may be applied a plural number of times to cover the entire region of the first separation layer 120. The light beam may also be applied twice or more to a certain point. Further, different kinds of light (laser) having different wavelengths (different wavelength ranges) may be applied twice or more to a certain region or different regions.

Figure 5:
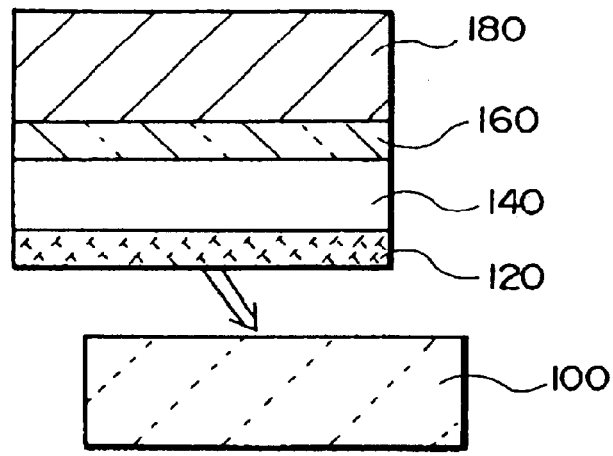
FIG. 5 is a sectional view showing a fifth step in the first embodiment of the thin film device transfer method according to the present invention.

After the abovementioned step, the substrate 100 is removed from the first separation layer by applying a force on the substrate 100 as shown in FIG. 5. In removal of the substrate 100, a part of the first separation layer 120 may adhere thereto, though not shown in FIG. 5.

[Step 6]

Figure 6:
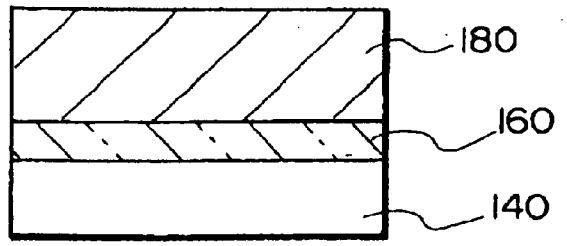
FIG. 6 is a sectional view showing a sixth step in the first embodiment of the thin film device transfer method according to the present invention.

Then, as shown in FIG. 6, the remaining first separation layer 120 is removed by cleaning, etching, ashing, polishing, or a combination thereof, for example. The object-of-transfer layer (thin film device layer) 140 is thus transferred to the primary destination-of-transfer part 180.

If a part of the first separation layer 120 adheres to the removed substrate 100, it is eliminated in the sane manner as mentioned above. In a situation where the substrate 200 is made of an expensive material such as quartz glass or any scarce material, the substrate 300 is preferably reused (recycled). Since the present invention is applicable to recycling the substrate 100, it can provide a high degree of usefulness.

[Step 7]

Figure 7:
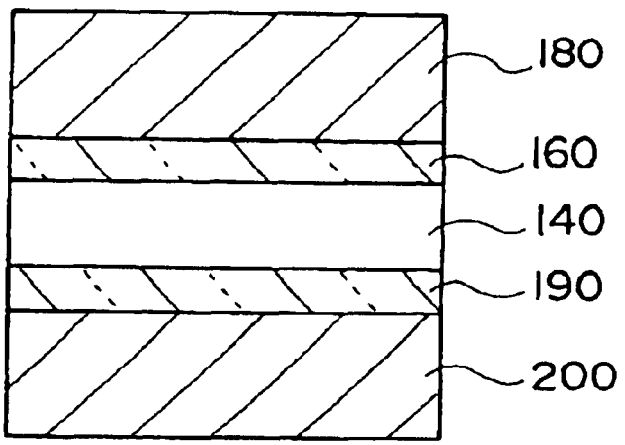
FIG. 7 is a sectional view showing a seventh step in the first embodiment of the thin film device transfer method according to the present invention.

Then, as shown in FIG. 7, a secondary destination-of-transfer part 200 is attached to the bottom (exposed side) of the thin film device layer 140 via an adhesive layer 190.

Examples of suitable adhesive materials for the adhesive layer 190 include a variety of hardening-type adhesives such as reaction-setting adhesive, thermo-setting adhesive, photo-curable adhesive such as ultraviolet-curable adhesive, and anaerobic-setting adhesive. The adhesive material of the adhesive layer 190 may contain epoxy, acrylate, silicone or any other kinds of substances. The adhesive layer 190 made of such a material is formed by a coating method, for example.

Where any hardening-type adhesive is used, it is applied to the bottom of the object-of-transfer layer (thin film device layer) 140 and the secondary destination-of-transfer part 200 is attached there to. Then, the hardening-type adhesive is hardened using a setting method suitable for the characteristics thereof. The secondary destination-of-transfer part 200 is thus secured to the object-of-transfer layer (thin film device layer) 140.

In the case where a photo-curable adhesive is used, it is preferable to apply light through the secondary destination-of-transfer part 200 which transmits light. Where a photo-curable adhesive such as an ultraviolet-curable adhesive having little adverse effect on the thin film device layer is used, light may be applied through the light transmitting primary destination-of-transfer part 180 or though both sides of the light transmitting primary and secondary destination-of-transfer parts 180 and 200.

In an arrangement differing from that shown in FIG. 7, the adhesive layer 190 may be formed on the secondary destination-of-transfer part 200 and the object-of-transfer layer (thin film device layer) 140 may be attached there to. In the case where the secondary destination-of-transfer part 200 has adhesive properties, formation of the adhesive layer 190 may be omitted.

As a material for the secondary destination-of-transfer part 200, a transparent substrate (sheet material) is applicable, though not limited thereto. The substrate may be a flat sheet or a curved sheet. Further, the secondary destination-of-transfer part 200 may be inferior to the substrate 100 in such characteristics as heat resistance and corrosion resistance. In the present invention, since the object-of-transfer layer (thin film device layer) 140 is formed on the substrate 100 side and then the object-of-transfer layer (thin film device layer) 140 is transferred to the secondary destination-of-transfer part 200, determination of characteristics required for the secondary destination-of-transfer part 200, in particular, heat resistance property does not depend on the conditions such as temperature condition which is required for formation of the object-of-transfer layer (thin film device layer) 140. In this respect, the primary destination-of-transfer part 180 may be made of a similar material.

Therefore, assuming that a maximum temperature in formation of the object-of-transfer layer 140 is $T_{max}$, the primary and secondary destination-of-transfer parts 180 and 200 may be made of a material having a glass transition temperature (Tg) or softening point lower than the $T_{max}$. For example, the primary and secondary destination-of-transfer parts 180 and 200 may be made of a material having a glass transition temperature (Tg) or softening point that is preferably 800° C. or lower, more preferably 500° C. or lower, and most preferably 320° C. or lower.

Further, as to mechanical characteristics, the primary and secondary destination-of-transfer parts 180 and 200 preferably have a certain degree of rigidity (strength). The primary and secondary destination-of-transfer parts 180 and 200 may also have flexibility or elasticity.

As materials of the primary and secondary destination-of-transfer parts 180 and 200, a variety of synthetic resin materials and glass materials are applicable. It is particularly preferable to use a synthetic resin material or an ordinary inexpensive glass material (having a low melting point).

A thermoplastic synthetic resin material or a thermosetting synthetic resin material may be used. For example, the following synthetic resin materials are applicable; polyethylene, polypropylene, ethylene-propylene copolymer, ethylene-vinyl acetate copolymer (EVA), other polyolefine resins, cyclic polyolefine, modified polyolefine, polyvinyl chloride, polyvinylidene chloride, polystyrene, polyamide, polyimide, polyamide-imide, polycarbonate, poly (4-methylbenzene-1)ionomer, acrylic resin, polymethylmethacrylate, acryl-styrene copolymer (AS resin), butadiene-styrene copolymer, polyo copolymer (EVOH), polyethylene terephthalate (PET), polybutylene terephthalate (PBT), polycyclohexane terephthalate (PCT) other polyester resins, polyether, polyetherketone (PEK), polyetheretherketone (PEEK), polyether imide, polyacetal (POM), polyphenylene oxide, modified polyphenylene oxide, polyalylate, aromatic polyester (liquid crystal polymer), polytetrafluorothyline, polyvinylidenefluoride, other fluorine-contained resins, styrene, polyolefine, polyvinyl chloride, polyurethane, fluorine-contained rubber, chlorinated polyethylene, other thermoplastic elastomer resins, epoxy resin, phenol resin, urea resin, melamine resin, unsaturated polyester resin, silicone resin, polyurethane resin, copolymer made of these substances, blend resin, polymer alloy, etc. One or more kinds or materials listed above may be used in combination (e.g., as a layering structure containing a plurality of sub-layers).

As examples of glass materials, the following are applicable; silica glass (quartz glass), silica alkaline glass, soda-lime glass, potash-lime glass, lead (alkaline) glass, barium glass, borosilicate glass, and the like. Except for silica glass, these glass materials have a relatively low melting point. Since these glass materials are relatively easy to form and process and relatively inexpensive, it is preferable to use them.

In the case where the secondary destination-of-transfer part 200 is made of synthetic resin, it can be molded integrally in a large sire. It is also easy to produce a curved resin sheet or a resin sheet having complex configurations such as concavity and convexity. Further, the cost of raw materials for synthetic resin and the cost of manufacturing synthetic resin are advantageously low. The use of synthetic resin is therefore advantageous in that a large-sized device (e.g., liquid crystal display) can be produced at low cost.

The secondary destination-of-transfer part 200 may comprise an independent device such as a liquid crystal cell, or it may comprise a part of a device such as a color filter, electrode layer, dielectric layer, insulation layer or semiconductor element.

Further, the primary and secondary destination-of-transfer parts 180 and 200 may be made of a material such as metal, ceramic, stone, wood and paper. Still further, the primary and secondary destination-of-transfer parts 180 and 200 may be mounted on the surface of any product (such as surface of a watch, air-conditioner, printed circuit board) or the surface of any building structure member such as a wall, pillar, ceiling or glass window.

[Step 8]

Figure 8:
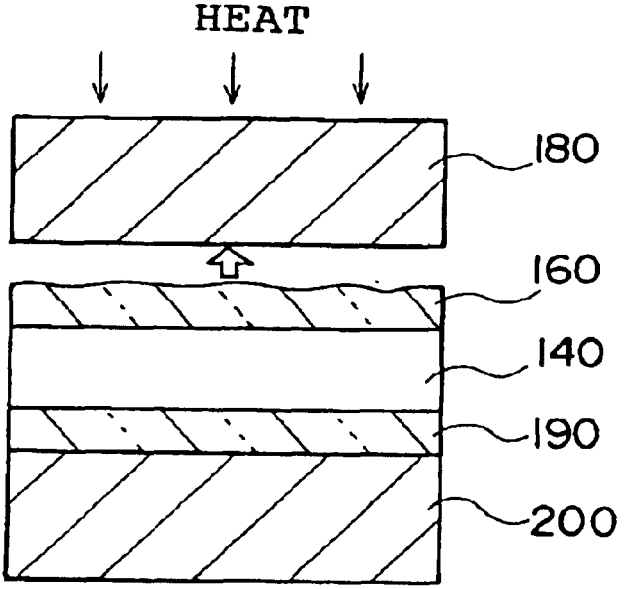
FIG. 8 is a sectional view showing an eighth step in the first embodiment of the thin film device transfer method according to the present invention.

Then, as shown in FIG. 8, the hot-melt adhesive layer 160 serving as the second separation layer is heated for thermal melting. Since the adhesive strength of the hot-melt adhesive layer 160 is thus reduced, the primary destination-of-transfer part 180 can be removed from the thin film device layer 140. If a part of the hot-melt adhesive material adheres to the primary destination-of-transfer part 180 is removed, the primary destination-of-transfer part 180 can be recycled.

[Step 9]

Figure 9:
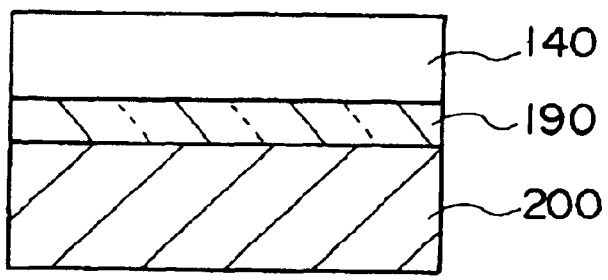
FIG. 9 is a sectional view showing a ninth step in the first embodiment of the thin film device transfer method according to the present invention.

Finally, the hot-melt adhesive layer 160 remaining on the thin film device layer 140 is removed. Thus, as shown in FIG. 9, the thin film device layer 140 transferred to the secondary destination-of-transfer layer 200 can be attained. In this step, the layering relationship between the thin film device layer 140 and the secondary destination-of-transfer part 200 same as that between the thin film device layer 140 and the substrate 100 shown in FIG. 2.

Transference of the object-of-transfer layer (thin film device layer) 140 to the secondary destination-of-transfer part 200 is accomplished through the processes mentioned above. Thereafter, an adjacent $SiO_2$ film may be removed from the object-of-transfer layer (thin film device layer) 140, or a conductive layer for wiring connections or any desired protective layer may be formed on the object-of-transfer layer 140.

In the present invention, the object-of-transfer layer (thin film device layer) 140, which is an object to be removed, is not directly exfoliated but is transferred through use of the first and second separation layers 120 and 160 in a separate manner to the secondary destination-of-transfer part 200. Therefore, regardless of its characteristics and conditions, separating object (the object-of-transfer layer 140) can be easily, securely and uniformly transferred. Since the separating object (object-of-transfer layer 140) is not damaged in separation, high reliability thereof can be maintained.

Second Embodiment

With reference to FIGS. 11 to 21, the following describes a specific example of a fabrication process in which CMOS-structure TFT devices are formed on a substrate and transferred to a destination-of-transfer part.

[Step 1]

Figure 11:
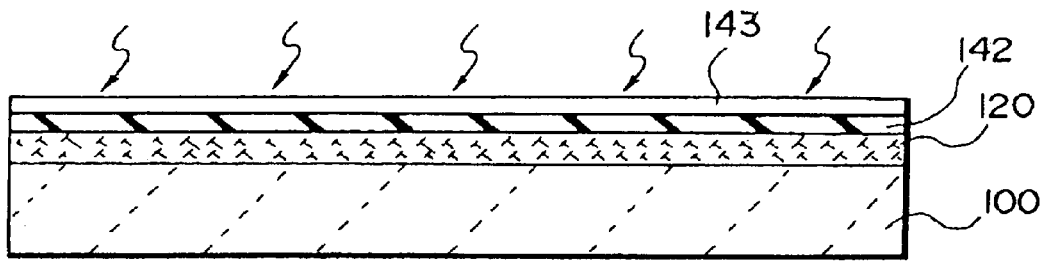
FIG. 11 is a sectional view showing a first step in a second embodiment of the thin film device transfer method according to the present invention.

As shown in FIG. 11, a first separation layer (e.g., an amorphous silicon layer formed using the LPCVD method) 120, an intermediate layer (e.g., $SiO_2$ film) 142, and an amorphous silicon layer (e.g., a layer formed using the LPCVD method) 143 are formed successively on a substrate (e.g., quartz substrate) 100. Then, the entire surface of the amorphous silicon layer 143 is irradiated with a laser beam for annealing. The amorphous silicon layer 143 is thus recrystallized to become a polysilicon layer.

[Step 2]

Figure 12:
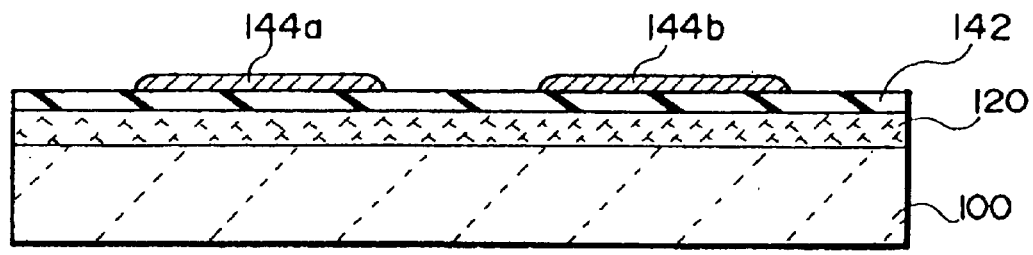
FIG. 12 is a sectional view showing a second step in the second embodiment of the thin film device transfer method according to the present invention.

Then, as shown in FIG. 12, the laser-annealed polysilicon layer is patterned to provider islands 144a and 144b.

[Step 3]

Figure 13:
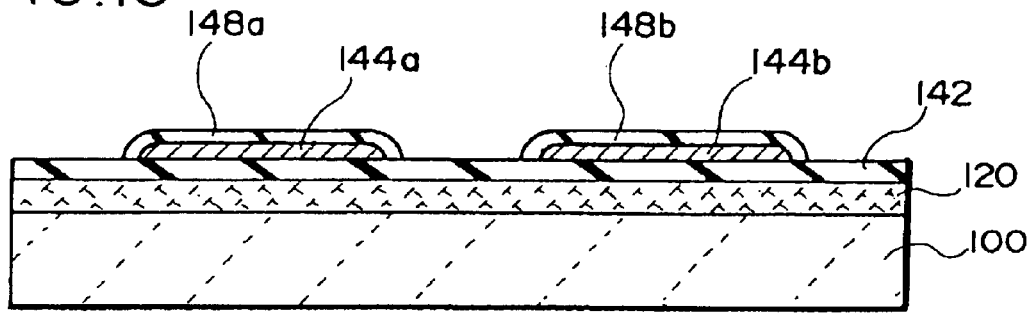
FIG. 13 is a sectional view showing a third step in the second embodiment of the thin film device transfer method according to the present invention.

As shown in FIG. 13, gate insulation films 148a and 148b are formed to cover the islands 144a and 144b using a CVD method, for example.

[Step 4]

Figure 14:
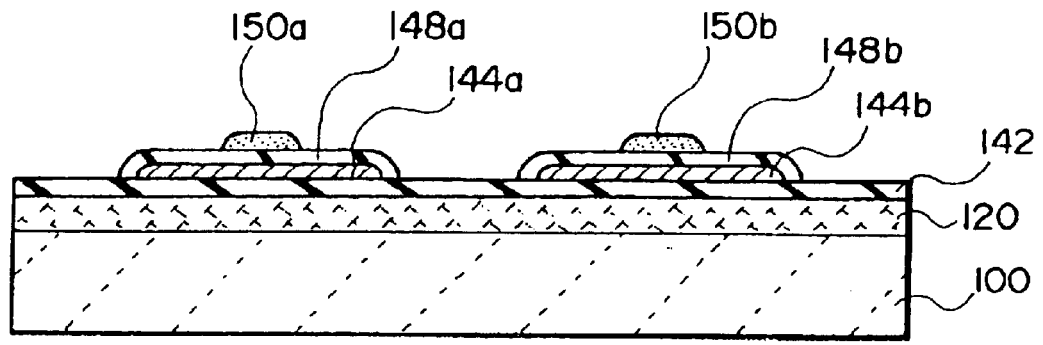
FIG. 14 is a sectional view showing a fourth step in the second embodiment of the thin film device transfer method according to the present invention.

As shown in FIG. 14, gate electrodes 150a and 150b made of polysilicon, metal or any other material are formed.

[Step 5]

Figure 15:
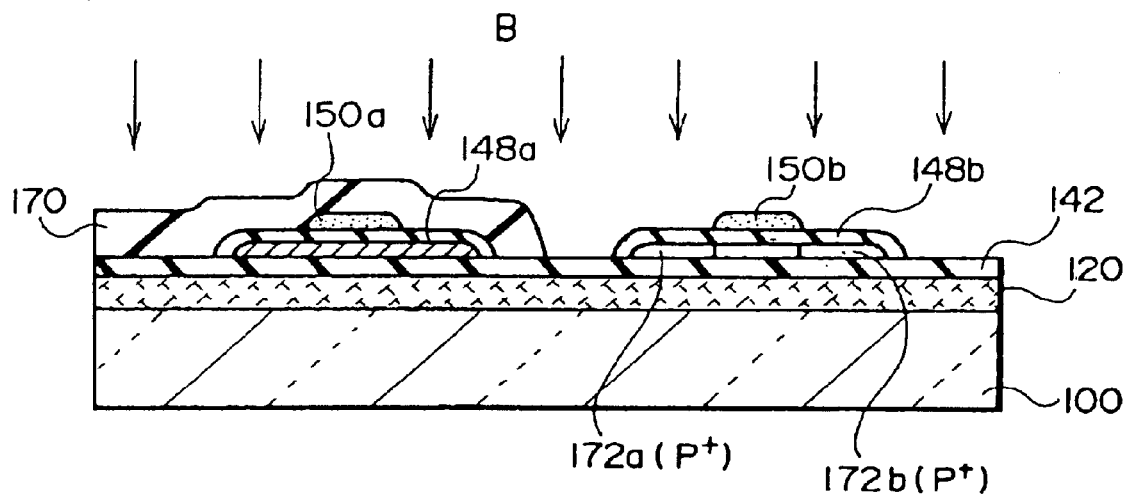
FIG. 15 is a sectional view showing a fifth step in the second embodiment of the thin film device transfer method according to the present invention.

As shown in FIG. 15, a mask layer 170 made of a material such as polyimide is formed. Using the gate electrode 150b and the mask layer 170 for the purpose of masking, ions (e.g., boron ions (B)) are implanted in a self-alignment fashion. Thus, p+ layers 172a and 172b are formed.

[Step 6]

Figure 16:
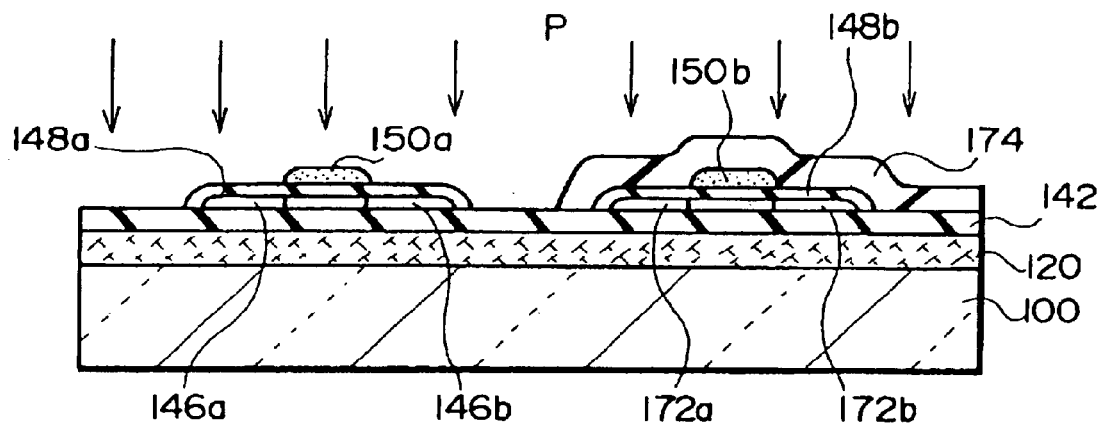
FIG. 16 is a sectional view showing a sixth step in the second embodiment of the thin film device transfer method according to the present invention.

As shown in FIG. 16, a mask layer 174 made of a material such as polyimide is formed. Using the gate electrode 150a and the mask layer 174 for the purpose of masking, ions (e.g., phosphorus ions (P)) are implanted in a self-alignment fashion. Thus, n+ layers 146a and 146b are formed.

[Step 7]

Figure 17:
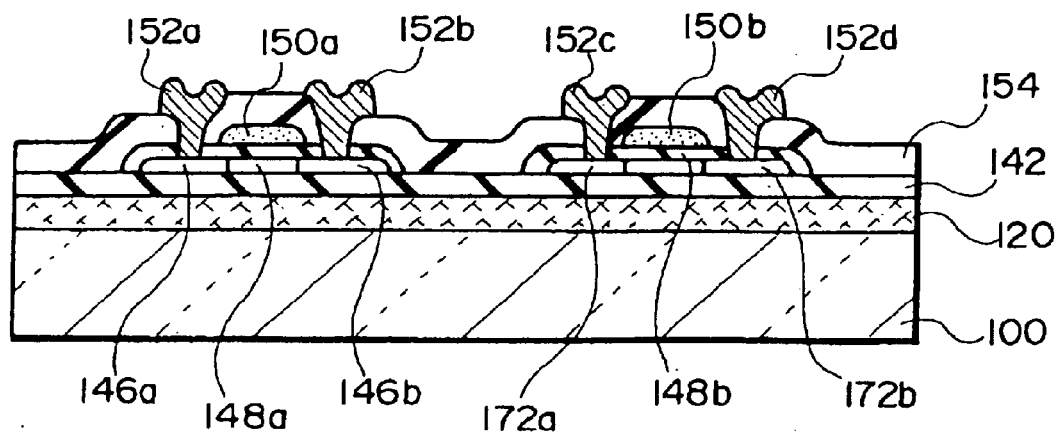
FIG. 17 is a sectional view showing a seventh step in the second embodiment of the thin film device transfer method according to the present invention.

As shown in FIG. 17, an inter-layer insulation film 154 is formed, contact holes are opened selectively, and then electrodes 152a to 152d are formed.

Thus, a layer of CMOS-structure TFTs is formed, which corresponds to the object-of-transfer layer (thin film device layer) 140 indicated in FIGS. 2 to 9. In addition, a protective film can be formed on the inter-layer insulation film 154.

[Step 8]

Figure 18:
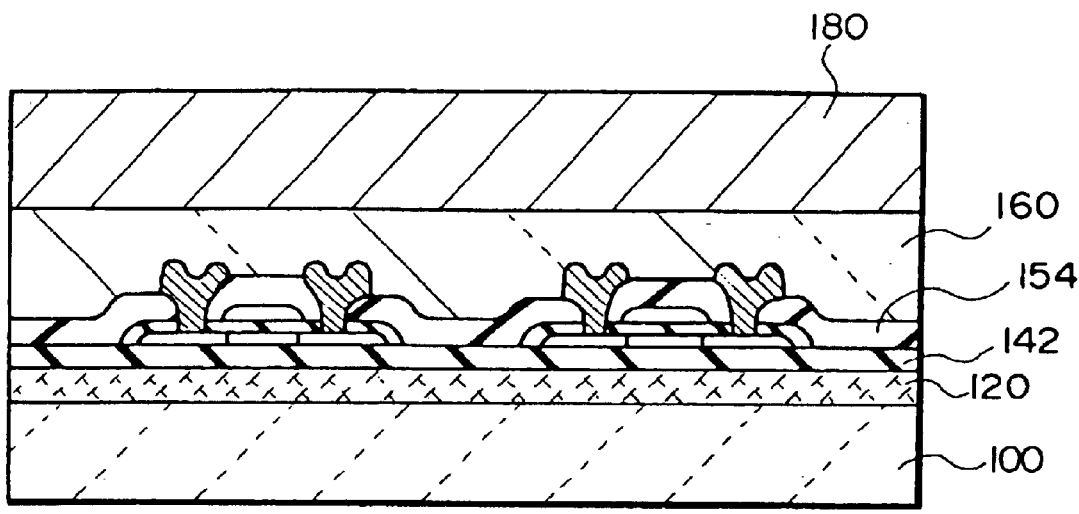
FIG. 18 is a sectional view showing an eighth step in the second embodiment of the thin film device transfer method according to the present invention.

As show in FIG. 18, a hot-melt adhesive layer 160 serving as a second separation layer is formed on the CMOS-structure TFT layer. In this step, irregularities on the surface of the TFT layer are flattened by means of the hot-melt adhesive layer 160. The second separation layer may be formed to provide an abrasion layer as in the case of the first separation layer.

In this step, it is preferable to form a protective layer such as an insulation layer on the TFT layer (thin film device layer) and then form the second separation layer on the protective layer. In particular, where the second separation layer is used as an abrasion layer, the thin film device layer can thus be protected by the protective layer at the time of abrasion.

Further, in the case where the second separation layer is formed to provide an abrasion layer, the second separation layer may be formed to contain a plurality of sub-layers as in the first separation layer. Still further, a light shielding layer such as metallic layer is preferably provided between the second separation layer and the thin film device layer. At the time of abrasion, incidence of light on the thin film device layer can thus be prevented.

After formation of the second separation layer, the TFT layer is attached to a primary destination-of-transfer part (e.g., soda-lime glass) 180 via a hot-melt adhesive layer 160 as the second separation layer.

[Step 9]

Figure 19:
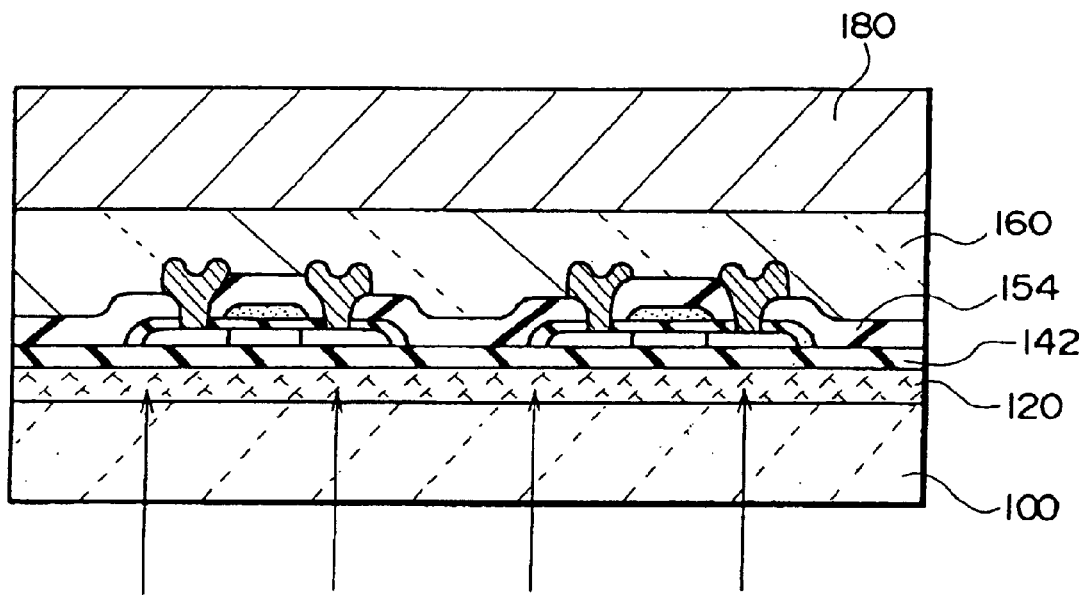
FIG. 19 is a sectional view showing a ninth step in the second embodiment of the thin film device transfer method according to the present invention.

As shown FIG. 19, the back side of the substrate 100 is irradiated with Xe—Cl excimer laser, for example. Thus, exfoliation is made to occur in an inner-layer part and/or interface of the first separation layer 120.

[Step 10]

Figure 20:
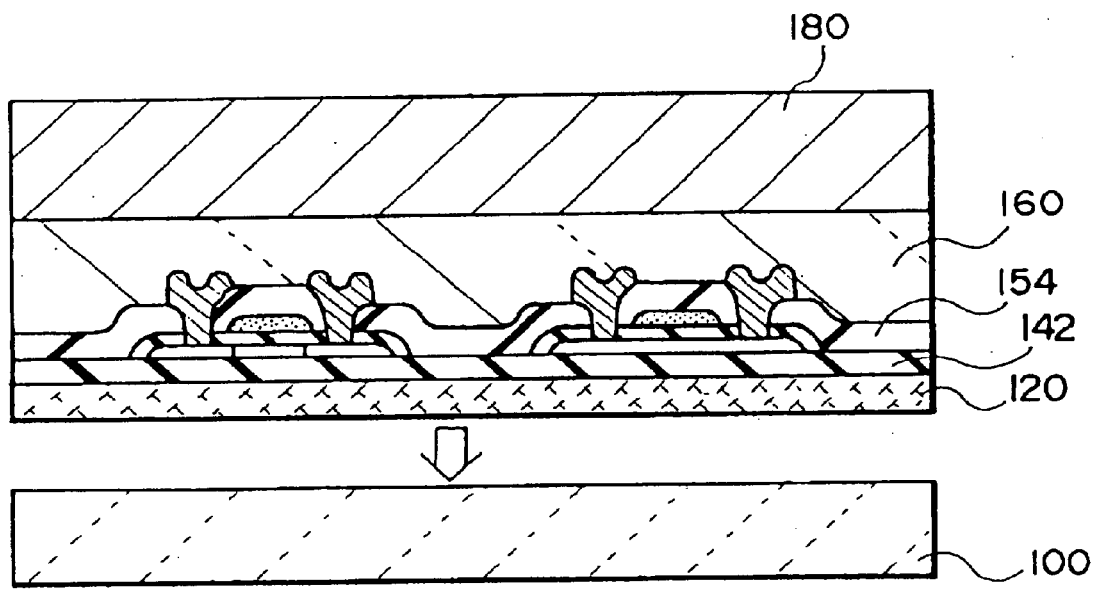
FIG. 20 is a sectional view showing a tenth step in the second embodiment of the thin film device transfer method according to the present invention.

As shown in FIG. 20, the substrate 100 is removed.

[Step 11]

Figure 21:
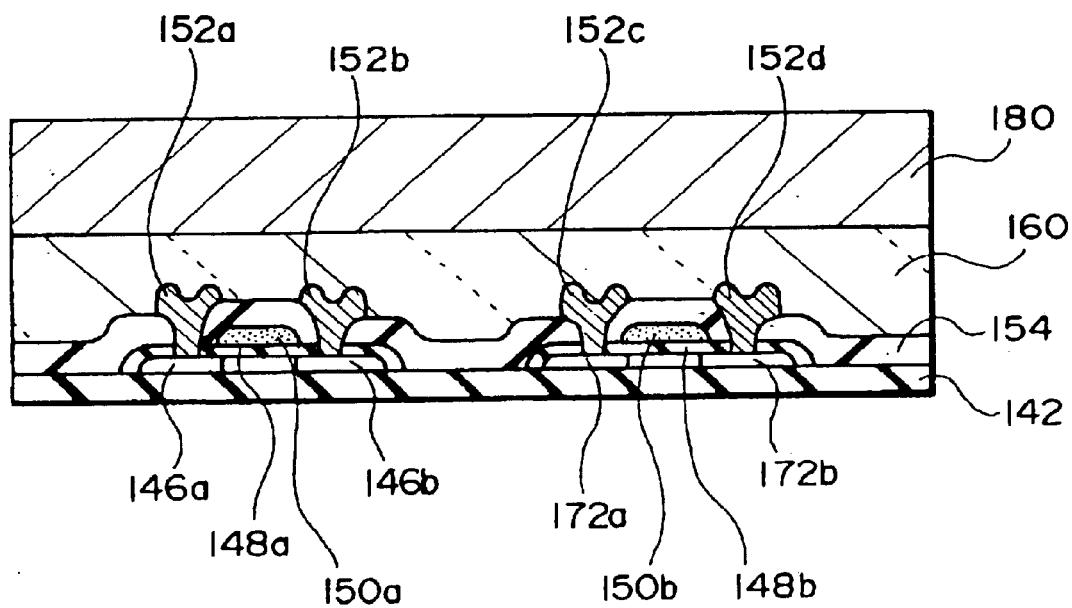
FIG. 21 is a sectional view showing an eleventh step in the second embodiment of the thin film device transfer method according to the present invention.

Further, the first separation layer 120 is removed by etching. The CMOS-structure TFT layer is thus transferred to the primary destination-of-transfer part 180 as shown in FIG. 21.

[Step 12]

Figure 22:
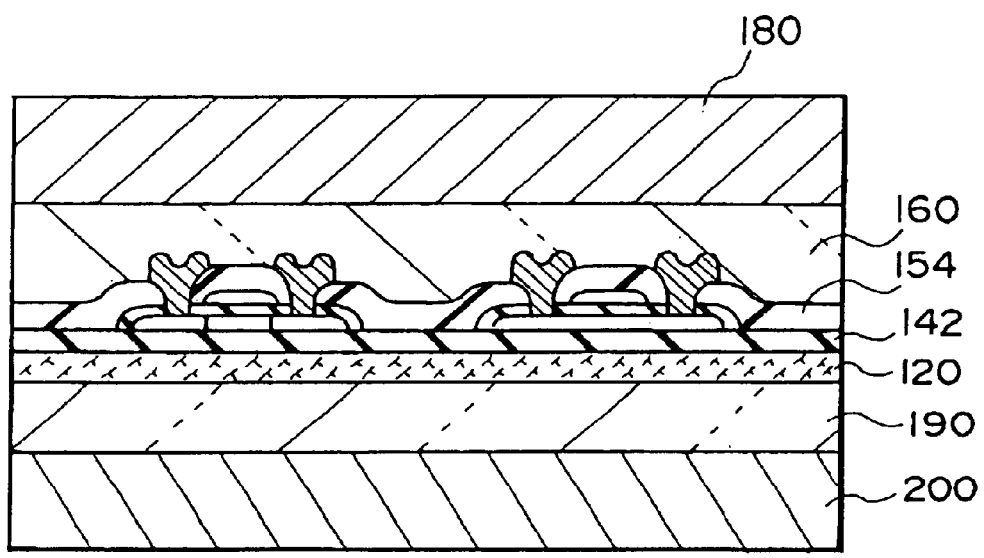
FIG. 22 is a sectional view showing a twelfth step in the second embodiment of the thin film device transfer method according to the present invention.

As shown in FIG. 22, an epoxy resin layer 190 is formed on the bottom of the CMOS-structure TFT layer as an adhesive layer having a hardening point lower than that of the hot-melt resin (adhesive) layer 160. Then, the TFT layer is attached to a secondary destination-of-transfer part (e.g., soda glass substrate) 200 via the epoxy resin layer 190. Thereafter, the epoxy resin layer 190 is hardened by applying heat thereto for bonding (attaching) the secondary destination-of-transfer part 200 and the TFT layer.

[Step 13]

Figure 23:
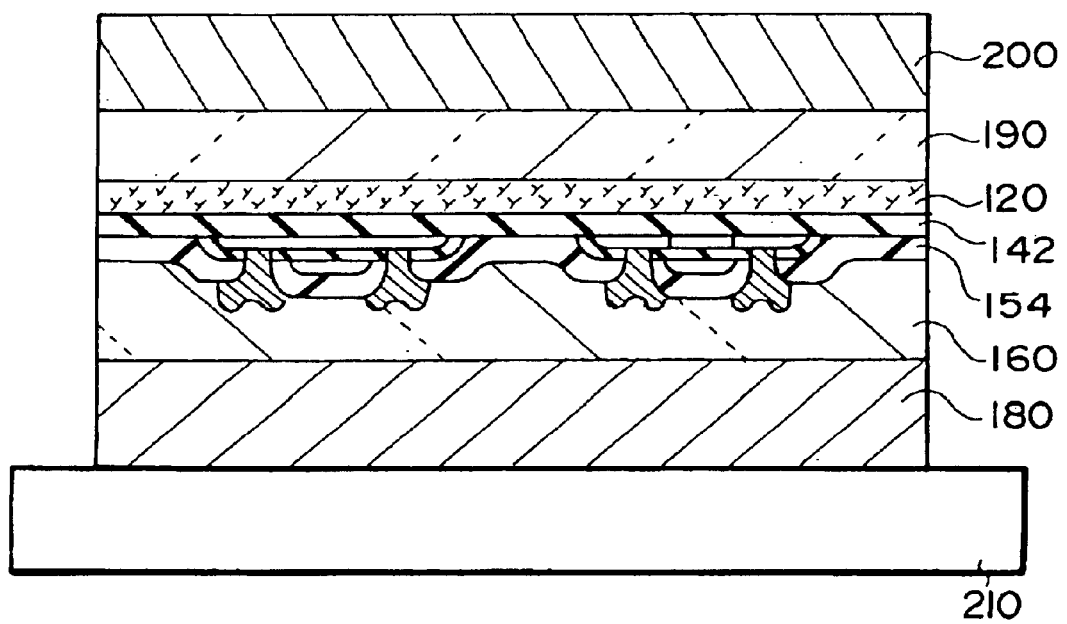
FIG. 23 is a sectional view showing a thirteenth step in the second embodiment of the thin film device transfer method according to the present invention.
Figure 24:
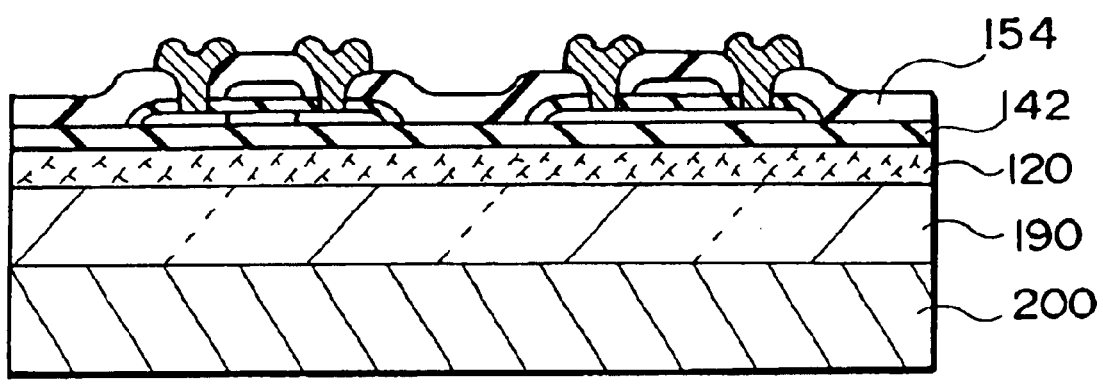
FIG. 24 is a sectional view showing a fourteenth step in the second embodiment of the thin film device transfer method according to the present invention.

Then, as shown in FIG. 23, the hot-melt resin layer 160 is thermally melted in an oven 210, for example. Using the hot-melt resin layer 160 as a boundary, the TFT layer is removed from the primary destination-of-transfer part 180. Further, the hot-melt resin layer 160 remaining on the bottom of the TFT layer is removed using xylene, for example. Thus, as shown in FIG. 24, the TFT layer is transferred to the secondary destination-of-transfer part 200. The state shown in FIG. 24 corresponds to that shown in FIG. 17, the substrate 300 and the first separation layer 120 being replaced with the secondary destination-of-transfer part 200 and the adhesive layer 190. Layering relationship of the TFT layer with respect to the substrate 100 employed for TFT fabrication is thus maintained on the secondary destination-of-transfer part 200. Thus, the electrodes 152a to 152d are exposed, it is therefore possible to provide contacts or wiring connections thereon with ease. After attaining the state shown in FIG. 24, a protective layer may be formed on the surface thereof.

Third Embodiment

Figure 25A:
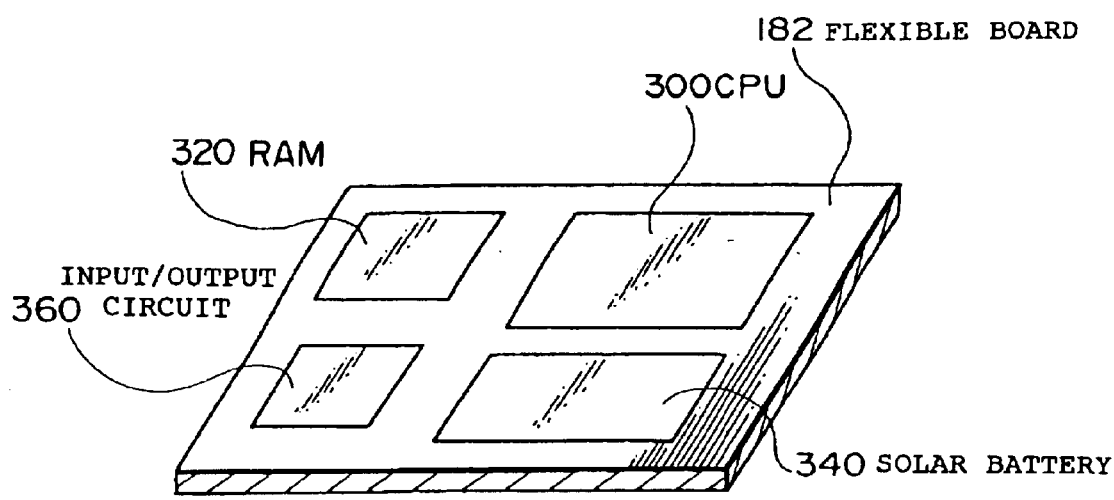
FIGS. 25A and 25D are perspective views showing a microcomputer fabricated in a third embodiment of the present invention.

Using the technique described in the abovementioned first and second embodiments, it is possible to form a microcomputer comprising thin film devices on a desired circuit board as shown in FIG. 25A.

In FIG. 25A, a CPU 300 of which circuit is structured using thin film devices, a RAM 320, an input/output circuit 360 and a solar battery 340 having amorphous silicon PIN junctions for supplying a power voltage thereto are mounted on a flexible circuit board 182 used as a secondary destination-of-transfer part made of a material such as plastic.

Figure 25B:
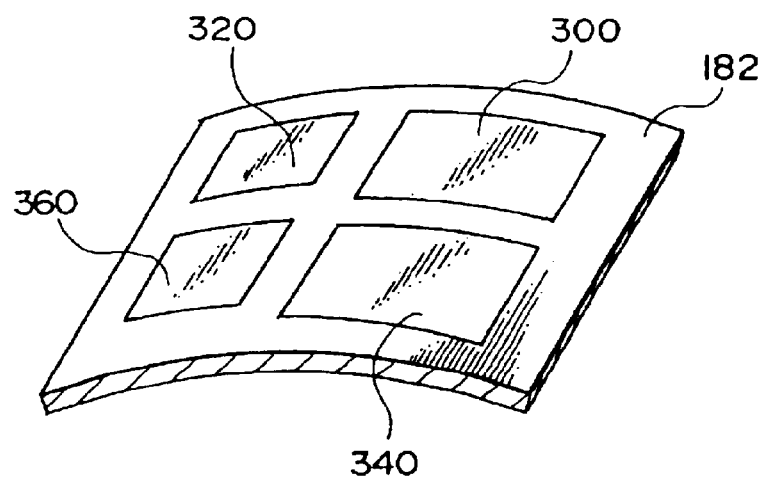

Since the microcomputer shown in FIG. 25A is formed on the flexible board 182 used as the secondary destination-of-transfer part, it may be curved as shown in FIG. 25B. Flexible and light in weight, the microcomputer is invulnerable to dropping. Further, the plastic board 182 may be provided for common use as a casing part of an electronic apparatus. It is thus possible to manufacture an electronic apparatus comprising thin film devices transferred to, at least, either the inside or outside of the casing part thereof.

Fourth Embodiment

Figure 26:
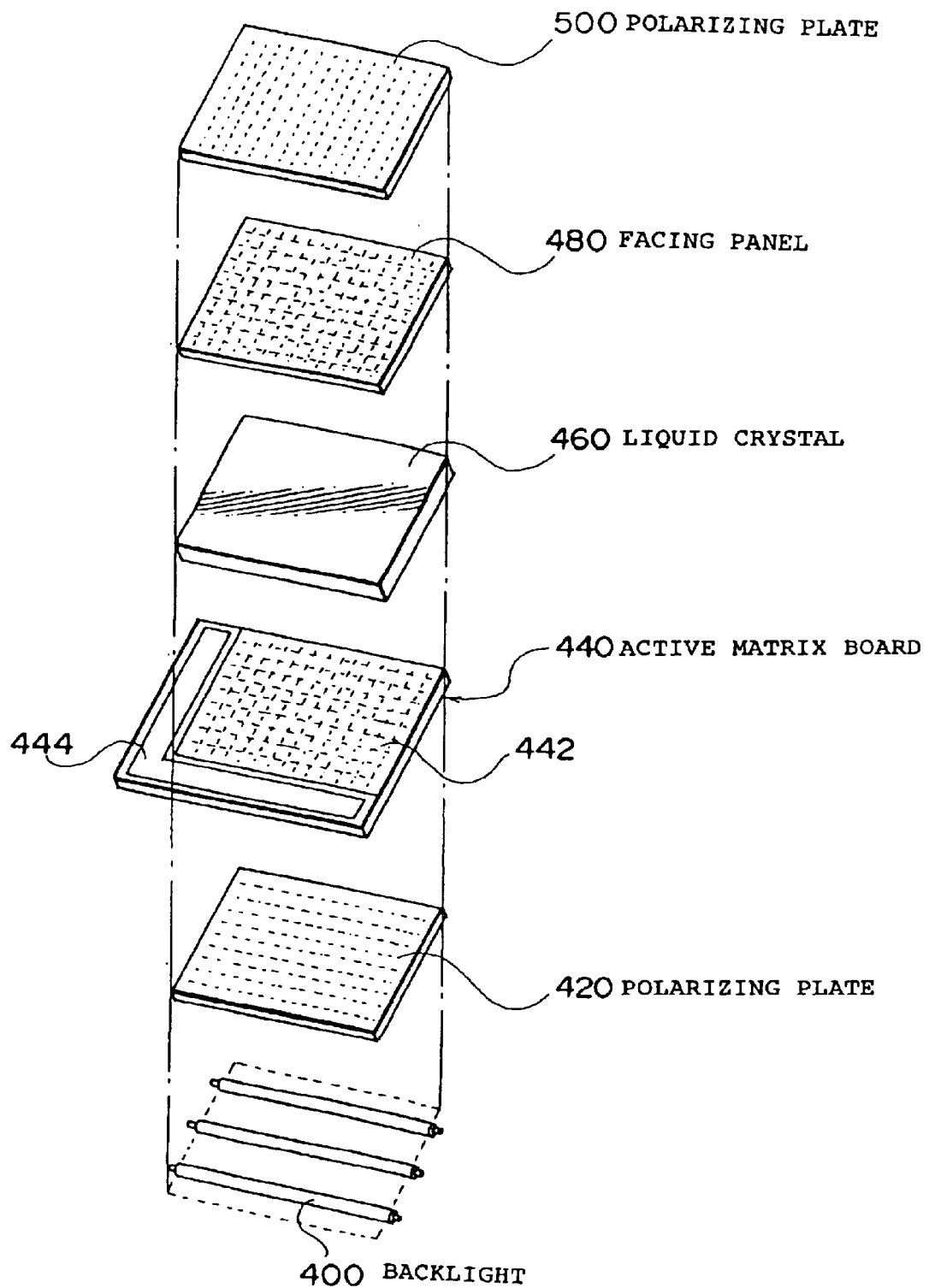
FIG. 26 is an explanatory diagram showing a structure of a liquid crystal display device in a fourth embodiment of the present invention.

The following describes an example of a fabrication process in which an active matrix liquid crystal display comprising an active matrix board as shown in FIG. 26 is manufactured using the thin film device transfer technique mentioned above.

(Composition of Liquid Crystal Display)

As shown in FIG. 26, the active matrix liquid crystal display comprises an illumination source 400 such as backlighting, a polarizing plate 420, an active matrix board 440, a liquid crystal part 460, a facing panel 480, and a polarizing plate 500.

Where each of the active matrix board 440 and the racing panel 480 in the present invention is formed of a flexible board like a plastic film, a reflection-type liquid crystal panel can be structured using a reflection plate instead of the illumination source 400. It is thus possible to realize an active matrix liquid crystal display panel which is flexible, resistant to shock, and light in weight. In the case where pixel electrodes are made of metal, the reflection plate and the polarizing plate 420 are not required.

The active matrix board 440 in the present embodiment is a driver-incorporated type which is provided with TFTS on a pixel portion 442 and a driver portion 444 (including a scanning line driver and a data line driver).

Figure 27:
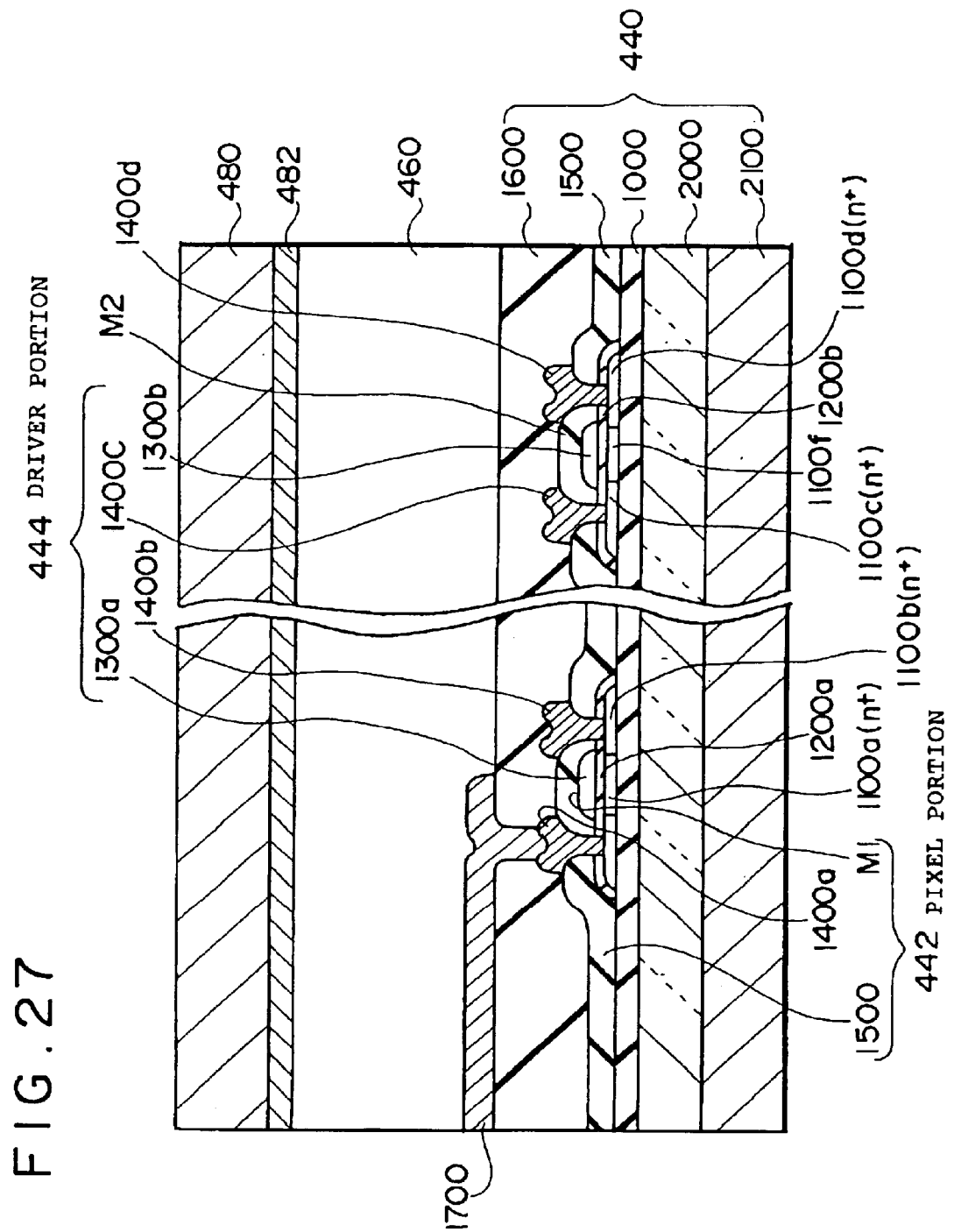
FIG. 27 is a sectional structure diagram showing main part of the liquid crystal display indicated in FIG. 26.
Figure 28:
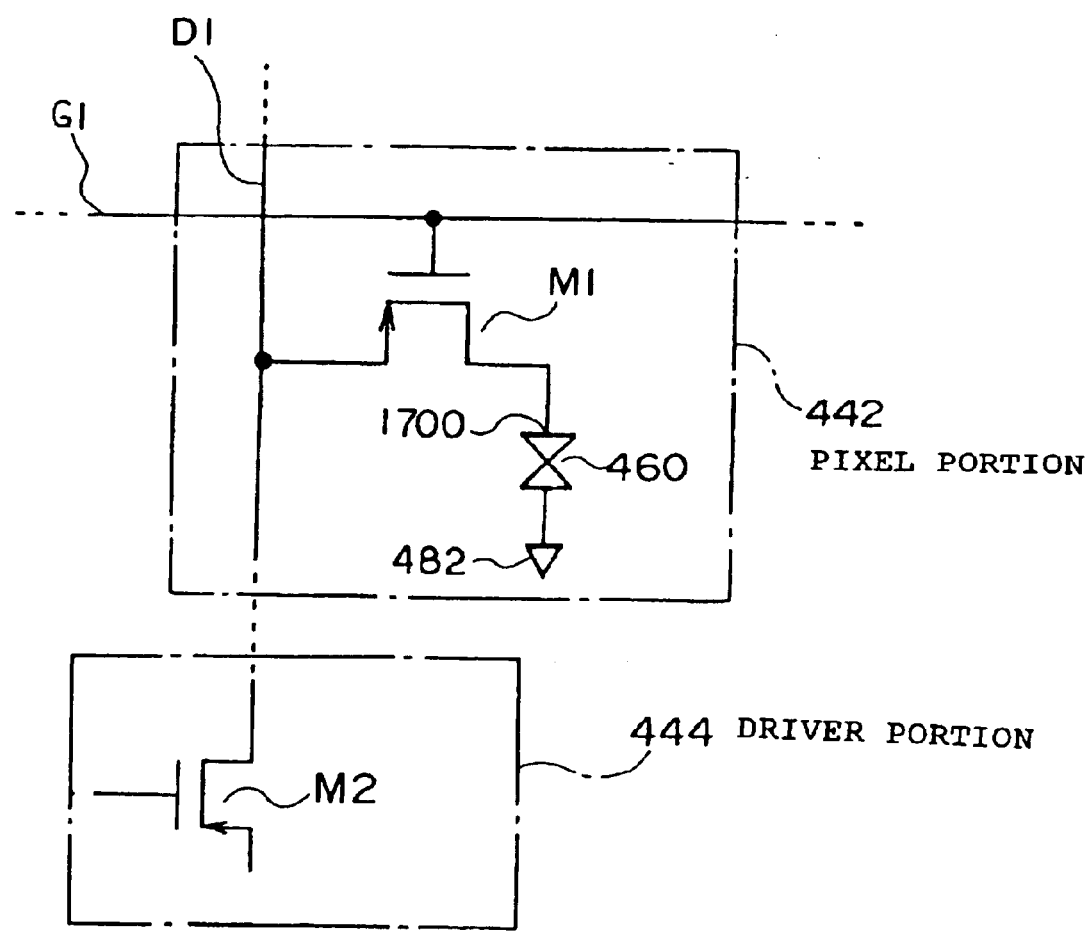
FIG. 28 is a circuit scheme for explanation of main part of the liquid crystal display indicated in FIG. 26.

FIG. 27 is a sectional structure diagram showing the main part of the active matrix liquid display panel, and FIG. 28 is a circuit structure showing the main part thereof.

As shown in FIG. 28, the pixel part 442 includes a TFT (M1) of which the gate is connected to a gate line G1, either one of the source or drain connected to a data line D1, and the other one (source or drain) connected to the liquid crystal part 460.

The driver portion 444 is structured to include a TFT (M2) formed through the same fabrication process as the TFT (M1).

As shown on the left of FIG. 27, the TFT (M1) in the pixel part 442 comprises source-drain layers 1100a and 1100b, a channel 1100e, a gate insulation film 1200a, a gate electrode 1300a, an insulation film 1500, and source-drain electrodes 1400a and 1400b.

Reference numeral 1700 indicates a pixel electrode, and reference numeral 1702 indicates a region in which the pixel electrode 1700 applies a voltage to the liquid crystal part 460 (voltage applying region to the liquid crystal part). An orientation film is not shown in the figure. The pixel electrode 1700 is formed of a material such as ITO (in case of a light transmission-type liquid crystal panel), or it is formed of aluminum or other metal (in case of a reflection-type liquid crystal panel).

As shown on the right of FIG. 27, the TFT (M2) constituting the driver portion 444 comprises source-drain layers 1100c and 1100d, a channel 1100f, a gate insulation film 1200b, a gate electrode 1300b, an insulation film 1500, and source-drain electrodes 1400c and 1400d.

In FIG. 27, reference numeral 480 indicates a facing panel (e.g., soda glass substrate), reference numeral 482 indicates a common electrode, reference numeral 1000 indicates an $SiO_2$ film, reference numeral 1600 indicates an inter-layer insulation film (e.g., $SiO_2$ film), reference numeral 1800 indicates an adhesive layer, and reference numeral 1900 indicates a soda glass substrate (destination-of-transfer part).

(Liquid Crystal Display Fabrication Process)

With reference to FIGS. 29 to 34, the following describes a fabrication process for the liquid crystal display shown in FIG. 27.

Figure 29:
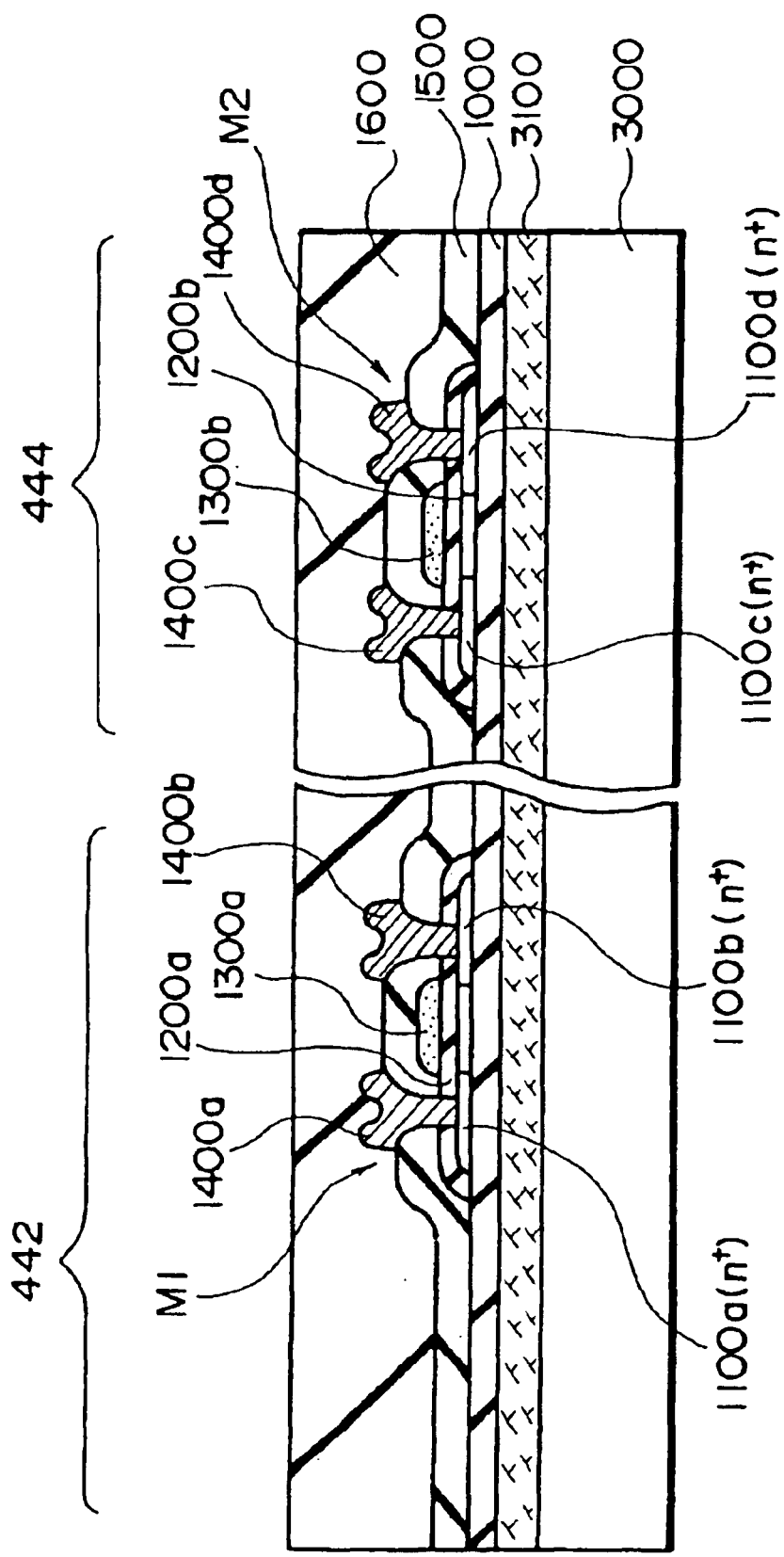
FIG. 29 is a sectional device diagram showing a first step in a method of fabricating an active matrix board according to the present invention.

Through the same fabrication steps as those shown in FIGS. 11 to 21, TFTs (M1 and M2) are formed on a highly reliable substrate 3000 (e.g., quartz glass substrate) which allows passage of a laser beam, and a protective film 1600 is formed thereon. In FIG. 29, reference numeral 3100 indicates a first separation layer (laser absorbing layer). Both the TFTs (M1 and M2) in FIG. 29 are n-type MOSFETs. It is to be understood that the present invention is not limited in its application to n-type MOSFETs. In practicing the present invention, p-type MOSFETs and CMOS-structure devices may be provided.

Figure 30:
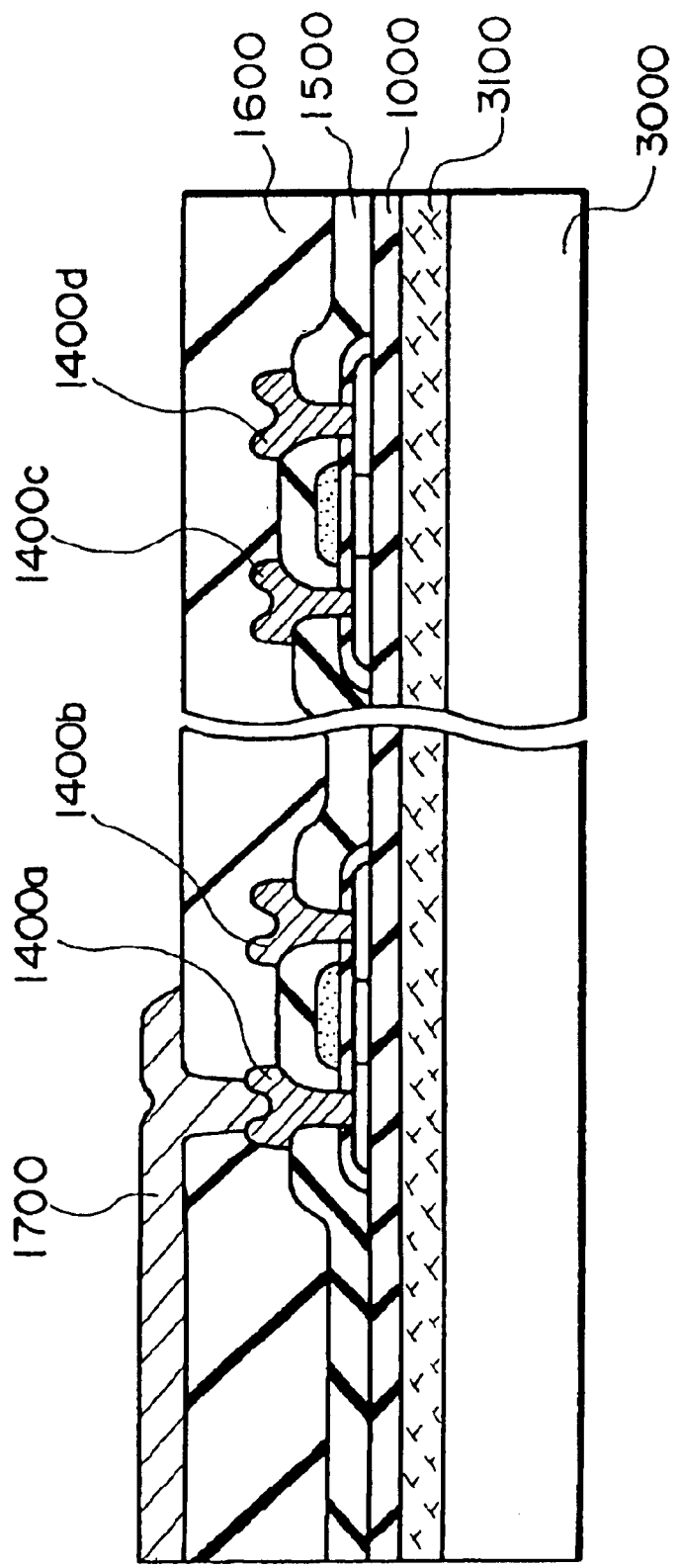
FIG. 30 is a sectional device diagram showing a second step in the method of fabricating the active matrix board according to the present invention.

Then, as shown in FIG. 30, the protective film 1600 is etched selectively to form a pixel electrode 1700 which is connected with an electrode 1400a. The pixel electrode 1700 is made of an ITO film or a metallic material such as aluminum. The ITO film is used when fabricating a transmission-type liquid crystal panel, or the metallic material (e.g., aluminum) is used when fabricating a reflection-type liquid crystal panel.

Figure 31:
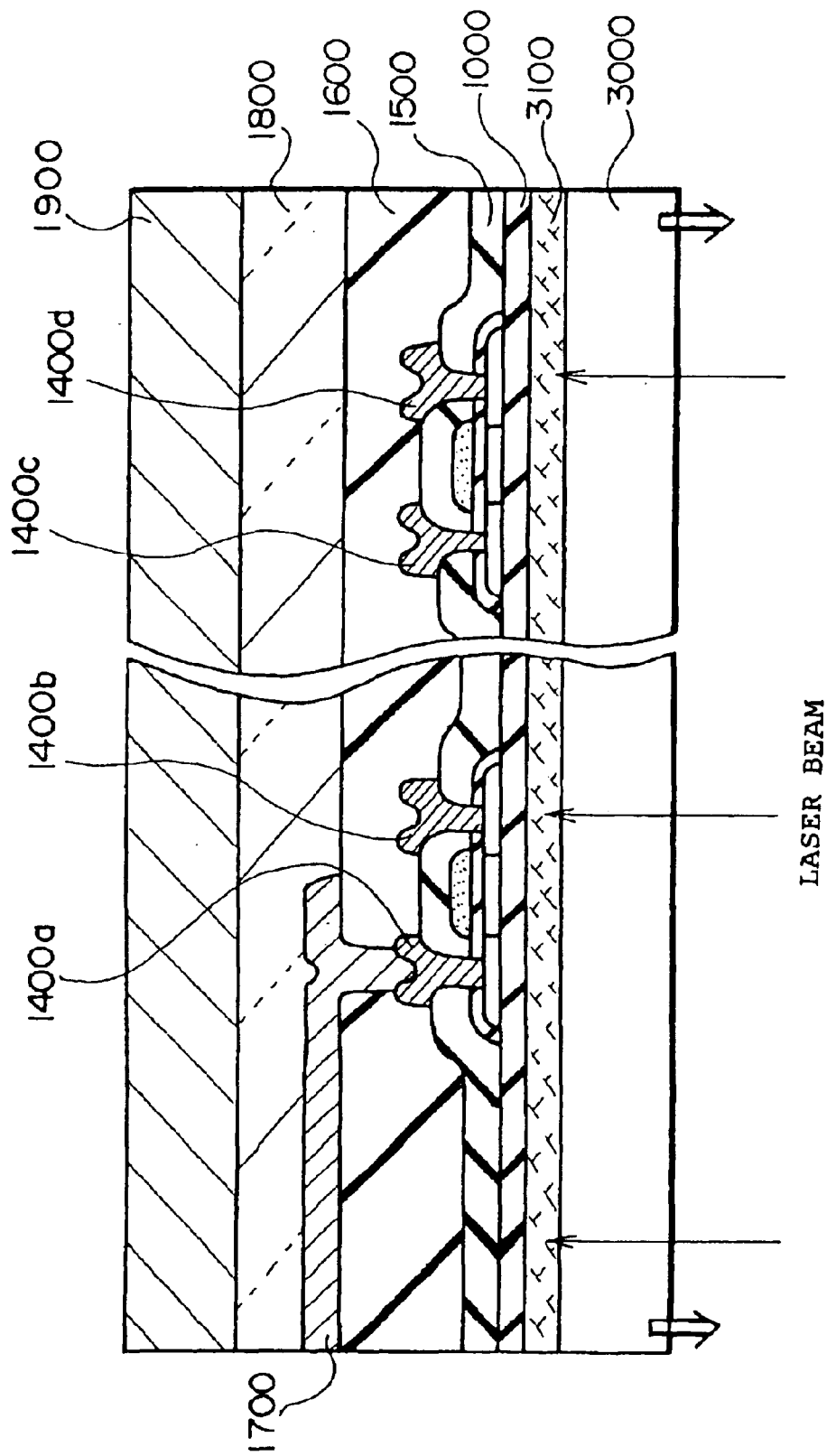
FIG. 31 is a sectional device diagram showing a third step in the method of fabricating the active matrix board according to the present invention.

Then, as shown in FIG. 31, a substrate 1900 serving as a primary destination-of-transfer part is attached via a hot-melt adhesive layer 1800 corresponding to a second separation layer. The second separation layer may be formed to provide an abrasion layer as in the case of the first separation layer.

Then, as shown in FIG. 31, the bottom of the substrate 3000 is irradiated using an excimer laser. After irradiation with the excimer laser, the substrate 3000 is removed.

Figure 32:
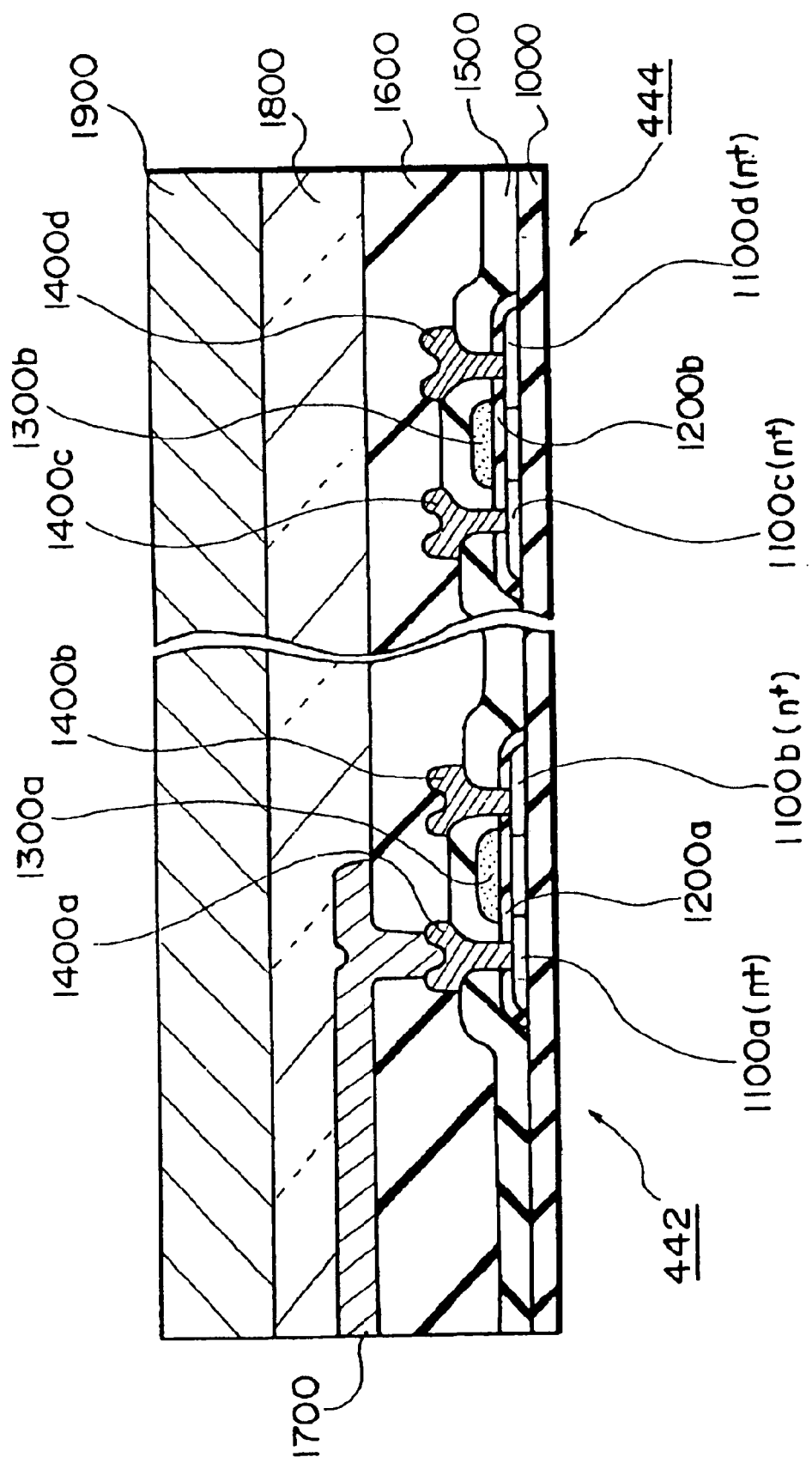
FIG. 32 is a sectional device diagram showing a fourth step in the method of fabricating the active matrix board according to the present invention.

Then, the first separation layer (laser absorbing layer) is removed. Thus, the pixel part 442 and the driver circuit 44 are transferred to the primary destination-of-transfer part 1900 as shown in FIG. 32.

Figure 33:
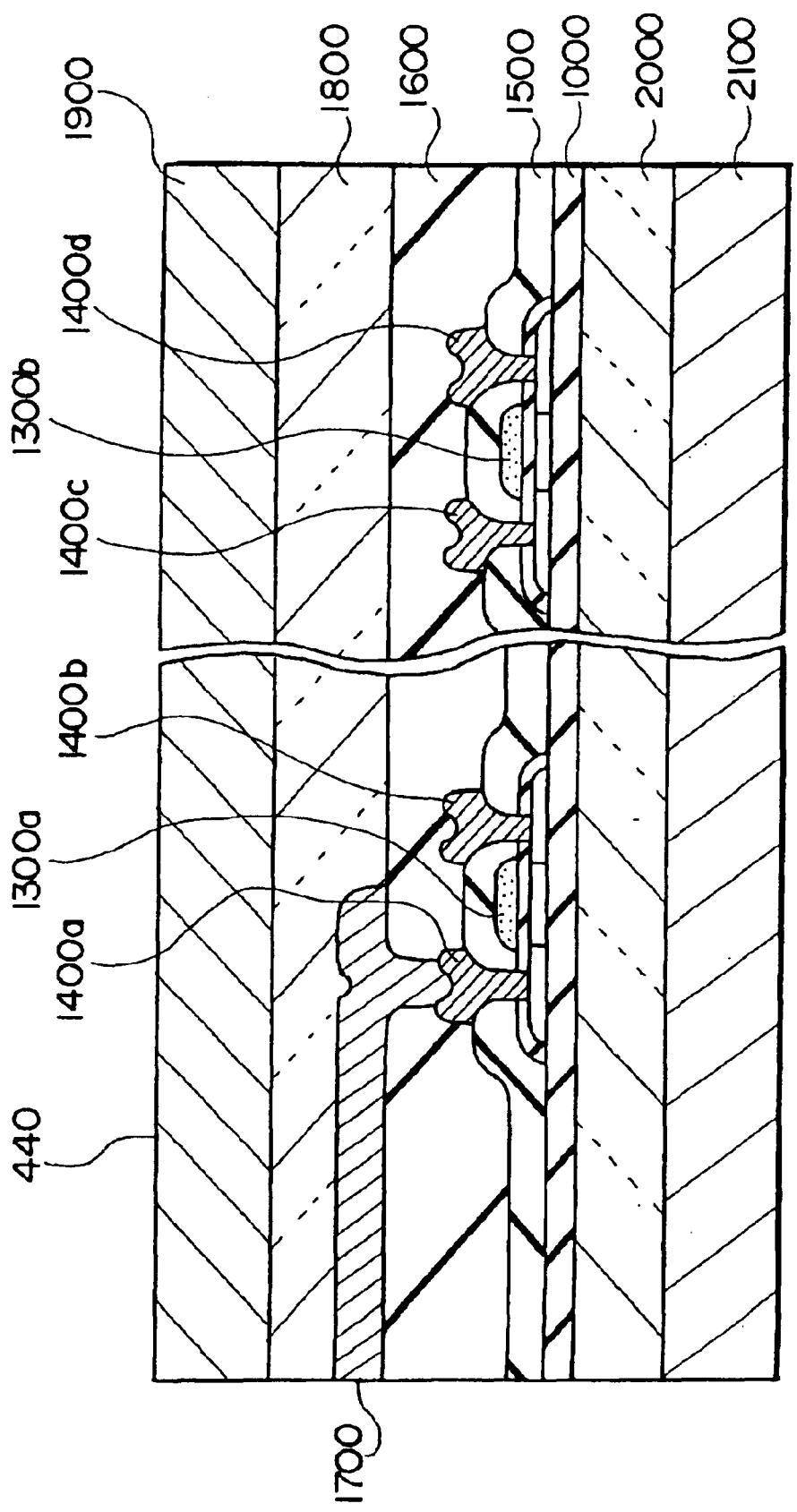
FIG. 33 is a sectional device diagram showing a fifth step in the method of fabricating the active matrix board according to the present invention.

Then, as shown in FIG. 33, a secondary destination-of-transfer part 2100 is attached to the bottom of the $SiO^2$ film 1000 via a thermosetting adhesive layer 2000.

Thereafter, the primary destination-of-transfer part 1900 is placed in an oven, for example, in order to melt the hot-melt adhesive material 1800. Then, the primary destination-of-transfer part 1900 is removed. The protective film 1600 and the hot-melt adhesive layer 1900 remaining on the pixel electrode 1700 are also removed.

Figure 34:
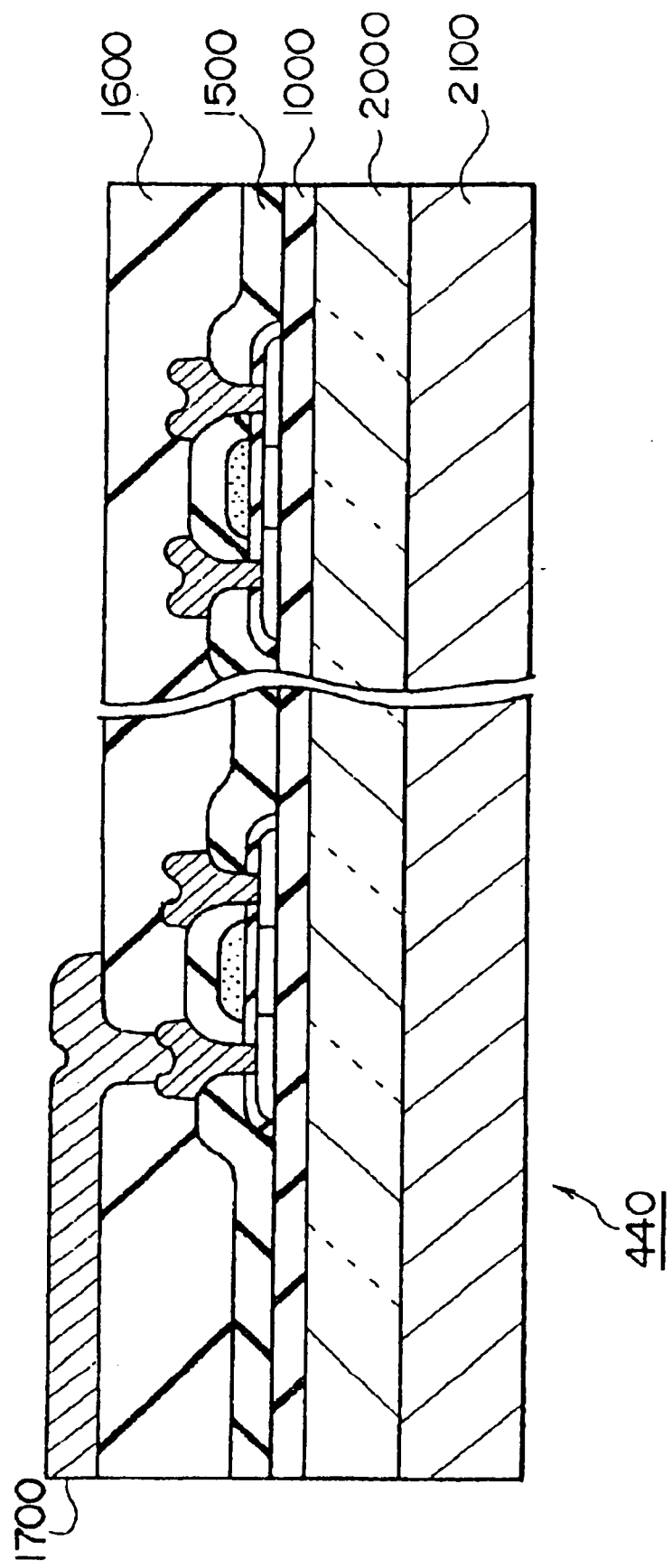
FIG. 34 is a sectional device diagram showing a fifth step in the method of fabricating the active matrix board according to the present invention.

In the manner mentioned above, the active matrix board 440 mounted on the secondary destination-of-transfer part 2100 is attained shown in FIG. 34. In this state, the pixel electrode 1700 is exposed on the surface of the active matrix board 440, and can be electrically connected to the liquid crystal. Thereafter, in an orientation treatment, an orientation film is formed on the surface of the insulation film ($SiO^2$ intermediate layer) 1000 and the surface of the pixel electrode 1700. The orientation film is not shown in FIG. 34.

Further, as shown in FIG. 27, a common electrode corresponding to the pixel electrode 1700 is formed on the active matrix board 440. Then, the facing panel 480 having its surface treated for orientation and the active matrix board 440 are sealed (with sealant), and liquid crystals are introduced therebetween. A liquid crystal display can thus be completed.

Fifth Embodiment

Figure 35:
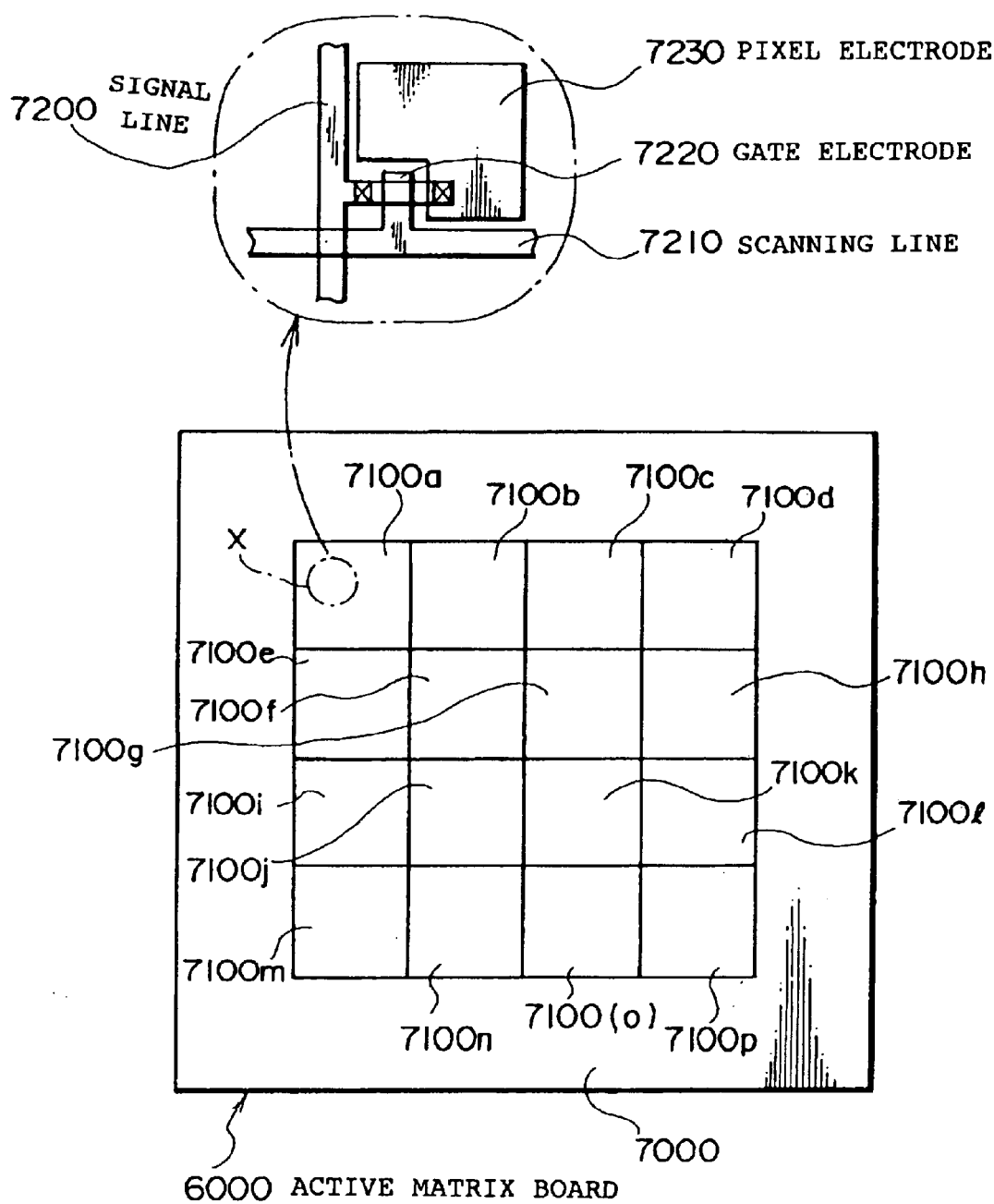
FIG. 35 is an explanatory diagram showing a fifth embodiment of the thin film device transfer method according to the present invention.

FIG. 35 shows a fifth embodiment of the invention.

In the present preferred embodiment, the thin film device transfer process mentioned above is carried out repetitively to transfer a plurality of patterns containing thin film devices to a substrate (destination-of-transfer part) which is larger than each object-of-transfer substrate. A large-sized active matrix board can thus be attained.

More specifically, the thin film device transfer process is repeated on a large substrate 7000 to form pixel portions 7100a to 7100p. At the top of FIG. 35, an enlarged view of each pixel part is shown (enclosed by the chain line). As shown in this enlarged view, each pixel part comprises a TFT and wire lines. In FIG. 35, reference numeral 7210 indicates a scanning line, reference numeral 7200 indicates a signal line, reference numeral 7220 indicates a gate electrode, and reference numeral 7230 indicates a pixel electrode.

It is possible to produce a large-sized active matrix board comprising highly reliable thin film devices by carrying out the thin film pattern transfer process a plural number of times using a highly reliable substrate repetitively or using a plurality of first substrates.

Sixth Embodiment

Figure 36:
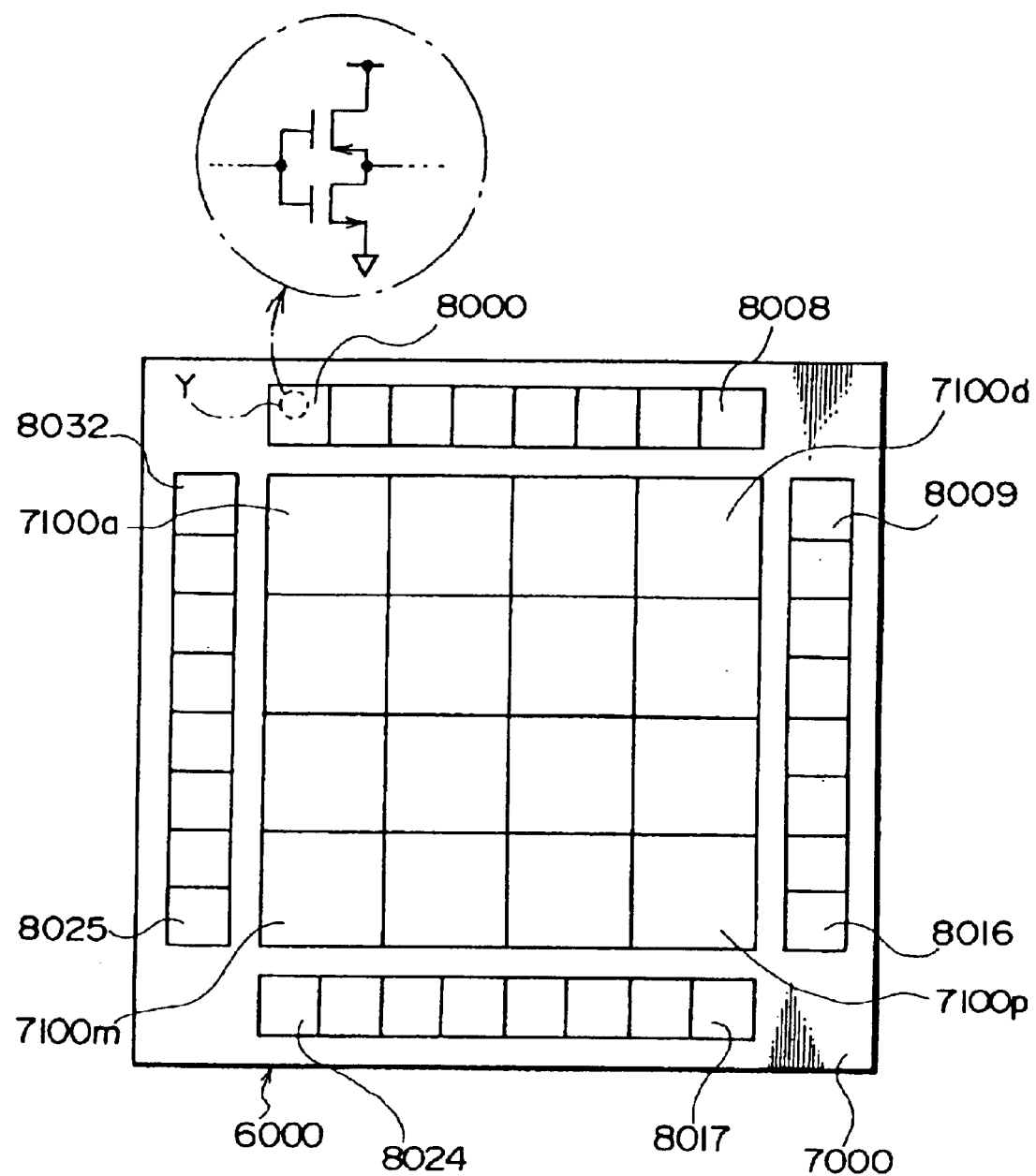
FIG. 36 is an explanatory diagram showing a sixth embodiment of the thin film device transfer method according to the present invention.

FIG. 36 shows a sixth embodiment of the invention.

In the present preferred embodiment, the thin film device transfer process mentioned above is carried out repetitively to transfer a plurality of patterns containing thin film devices, each having different design rule levels (thin film devices having different minimum line widths corresponding to different pattern design rule levels), to a substrate larger than each object-of-transfer substrate.

FIG. 36 illustrates an active matrix board having drivers mounted thereon. Through repetition of the thin film device transfer process, drivers 8000 to 8032 fabricated on a design rule finer than that for the pixel portions 7100a to 7100p are formed on the periphery of a substrate 6000.

Since a shift register constituting each driver circuit performs logic level operation at a low voltage, it may merely be necessary to satisfy a requirement for a withstand voltage lower than that of a pixel TFT. It is therefore possible to provide TFTs in an integration scale finer than that for pixel TFTs.

According to the present preferred embodiment, a plurality of circuits having different design rule levels (fabricated in different processes) can be realized on a single substrate. Since means for sampling a data signal under control of the shift register (thin film transistor M2 in FIG. 27) is required to satisfy the requirement for a withstand voltage as high as that of the pixel TFT, it is preferable to form the sampler means on the basis of the same design rule and in the same process as those of the pixel TFT.

Seventh Embodiment

Figure 37:
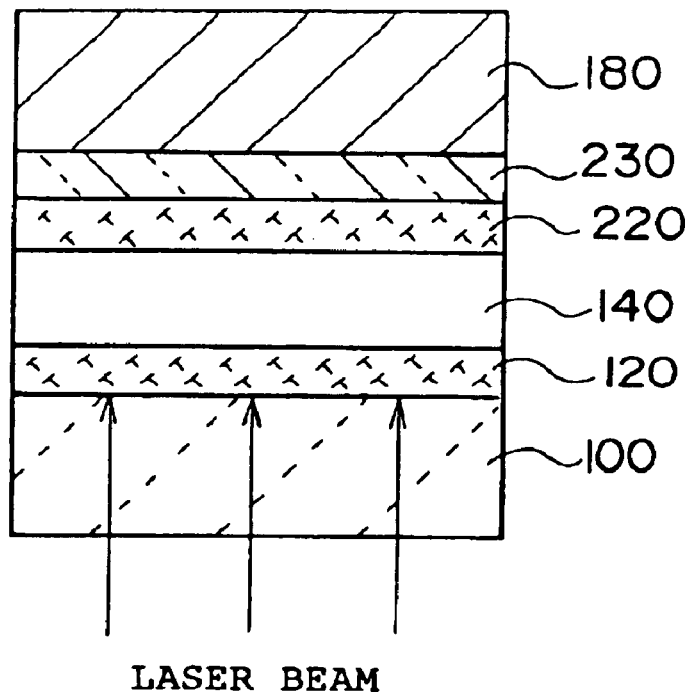
FIG. 37 is an explanatory diagram showing a first light irradiation step in a seventh embodiment of the thin film device transfer method according to the present invention.
Figure 38:
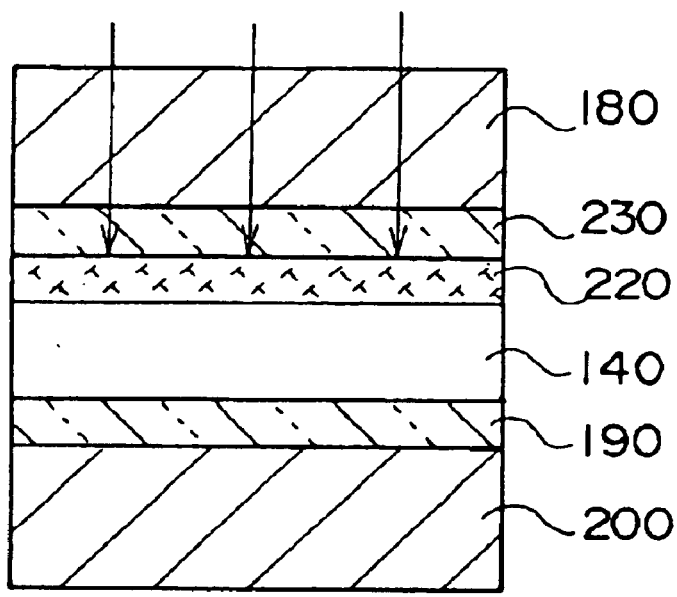
FIG. 38 is an explanatory diagram showing a second light irradiation step in the seventh embodiment of the thin film device transfer method according to the present invention.

FIGS. 37 and 38 show modified embodiments in which an amorphous silicon layer 220 equivalent to the first separation layer 120 in the first embodiment is used in place of the hot-melt adhesive layer 160 (second separation layer) employed in the first embodiment. As shown in FIG. 37, the primary destination-of-transfer part 180 is attached to the amorphous silicon layer 220 via an adhesive layer 230. FIG. 37 also shows a light irradiation process for inducing abrasion in the first separation layer 120, which corresponds to the step presented in FIG. 4.

After the light irradiation step in FIG. 37, the substrate 100 and the first separation layer 120 are removed from the bottom of the thin film device layer 140. Then, as shown in FIG. 38, the secondary destination-of-transfer part 200 is attached to the bottom of the thin film device layer 140 via the adhesive layer 190. Thereafter, as shown in FIG. 38, the amorphous silicon layer 220 is irradiated with light through the primary destination-of-transfer part 180, thereby causing abrasion in the amorphous silicon layer 220. Resultantly, the primary destination-of-transfer part 180 and the adhesive layer 230 can be removed from the thin film device layer 140.

As exemplified above, abrasion may be made to occur in both the first and second separation layers in succession for transferring the thin film device layer 140 to the secondary destination-of-transfer part 200 in the present invention.

The following describes actual examples of the present invention.

EXAMPLE 1

A quartz substrate 50 mm long, 50 mm wide and 1.1 mm thick (softening point: 1630° C., distortion point: 1070° C., excimer laser transmittance: approx. 100%) was prepared. On one side of the quartz substrate, an amorphous silicon (a-Si) layer was formed as a first separation layer (laser absorbing layer) using a low-pressure CVD method ($Si_2H_6$ gas, 425° C.). The film thickness of the first separation layer was 100 nm.

Then, on the first separation layer, an $SiO_2$ film was formed as an intermediate layer using an ECR-CVD method ($SiH_6+O_2$ gas, 100° C.). The film thickness of the intermediate layer was 200 nm.

Then, on the intermediate layer, an amorphous silicon film was formed as an object-of-transfer layer using the low-pressure CVD method ($Si_2H_6$ gas, 425° C.). This amorphous silicon film was irradiated with laser beams (wavelength: 308 nm) for crystallization into a polysilicon film. Thereafter, the polysilicon film was patterned as specified to arrange source, drain and channel regions of thin film transistors. Then, after the surface of the polysilicon was thermally oxidized at a temperature higher than 1000° C. to provide a gate insulation film $SiO_2$, a gate electrode (having a laminar structure made of high-melting-point metal such as Mo on polysilicon) was formed on the gate insulation film. Using the gate electrode as a mask, ion implantation was carried out to form source and drain regions in a self-alignment fashion. Thus, thin film transistors were formed. Thereafter, electrodes and wire lines to the source and drain regions, and wire lines to the gate electrode may be formed as required. The material for these electrodes may be Al but is not limited thereto. Where there is a possibility that Al may melt from laser irradiation in a later step, it is advisable to use a metallic material having a melting point higher than Al (any metallic material that will not be melted by laser irradiation to be applied later).

Then, a hot-melt adhesive (trade name; Proof Wax) was applied on the thin film transistors thus formed, and a large-sized transparent glass substrate 200 mm long, 300 mm wide and 1.1 mm thick (soda-lime glass, softening point: 740° C. distortion point: 511° C.) was attached thereto as a primary destination-of-transfer part.

Then, the first separation layer was irradiated with an Xe—Cl excimer laser (wavelength: 308 nm) through the quartz substrate to cause exfoliation (inner-layer exfoliation and interface exfoliation). The energy density of the applied Xe—Cl excimer laser was 250 $mJ/cm^2$, and the irradiation time thereof was 20 nsec. Note that irradiation with an excimer laser is categorized into spot beam irradiation and line beam irradiation. In spot beam irradiation, a spot laser beam is applied to a predetermined unit region (e.g., 8 mm×8 mm), while being shifted in increments of approx. $\frac{1}{10}$ of the unit region. In line beam irradiation, a line laser beam is applied to a predetermined unit region (e.g., 378 mm×0.1 mm, or 378 mm×0.3 mm; a region where 90% or more of laser energy is attainable), while being shifted in increments of approx. $\frac{1}{10}$ of the unit region. Thus, each point on the first separation layer is irradiated with the laser at least ten times. This laser irradiation is carried out on the entire surface of the quartz substrate while each irradiated region is shifted.

Thereafter, the quartz substrate and the glass substrate (primary destination-of-transfer part) were removed from the first separation layer. Thus, the thin film transistor layer and the intermediate layer formed on the quarts substrate were primarily transferred to the glass substrate (primary destination-of-transfer part).

Then, the first separation layer adhering to the surface of the intermediate layer on the glass substrate was eliminated by a means such as etching, cleaning or a combination thereof. The quartz substrate was treated the same for recycling.

Further, an ultraviolet-curable adhesive was applied (film thickness: 10 μm) to the exposed intermediate layer, and a large-sized transparent glass substrate 200 mm long, 300 mm wide and 1.1 mm thick (soda-lime glass, softening point: 740° C., distortion point: 511° C.) was attached thereto as a secondary destination-of-transfer part. Then, the adhesive material was hardened by ultraviolet radiation through the glass substrate to bond the glass substrate securely.

Thereafter, the hot-melt adhesive material was thermally melted, and the glass substrate serving as the primary destination-of-transfer part was removed. In this manner, the thin film transistor layer and the intermediate layer were secondarily transferred to the glass substrate serving as the secondary destination-of-transfer part. The primary destination-of-transfer part may also be recycled.

In a situation where the glass substrate serving as the primary destination-of-transfer part is larger than the quartz substrate, primary transfer from the quartz substrate to the glass substrate in the present example may be repeated on regions having different planes. Thus, more thin film transistors can be formed on the glass substrate than on the quartz substrate. More thin film transistors can be formed on the glass substrate similarly by means of repetitive lamination. Still further, it is possible to form more thin film transistors than those formable on the quartz substrate by using a glass substrate (secondary destination-of-transfer part) which is larger than the primary destination-of-transfer part and the quartz substrate and by repeating the secondary transfer to the glass substrate.

EXAMPLE 2

As a first separation layer, an amorphous silicon film containing 20 atomic % of H (hydrogen) was used. The thin film transfer process was carried out in the same manner as in Example 1 except for this condition.

The quantity of H contained in the amorphous silicon film was adjusted by setting proper film formation parameters for a low-pressure CVD method.

EXAMPLE 3

As a first separation layer, a ceramic thin film formed through spin coating by a sol-gel method (composition: $PbTiO_2$, film thickness: 200 nm) was used. The thin film transistor process was carried out in the same manner as in Example 1 except for this condition.

EXAMPLE 4

As a first separation layer, a ceramic thin film formed by sputtering (composition: $BaTiO_3$, film thickness: 400 nm) was used. The thin film transistor process was carried out in the same manner as in Example 1 except for this condition.

EXAMPLE 5

As a first separation layer, a ceramic thin film formed by a laser abrasion method (composition: Pb (Zr, Ti) $O_3$ (PZT), film thickness: 50 nm) was used. The thin film transistor process was carried out in the same manner as in Example 1 except for this condition.

EXAMPLE 6

As a first separation layer, a polyimide film formed by spin coating (film thickness: 200 nm) was used. The thin film transistor process was carried out in the same manner as in Example 1 except for this condition.

EXAMPLE 7

As a first separation layer, a polyphenylene sulfide film formed by spin coating (film thickness: 200 nm) was used. The thin film transistor process was carried out in the same manner as in Example 1 except for this condition.

EXAMPLE 8

As a first separation layer, an aluminum layer formed by sputtering (film thickness: 300 nm) was used. The thin film transistor process was carried out in the same manner as in Example 1 except for this condition.

EXAMPLE 9

A Kr—F excimer laser (wavelength: 248 nm) was used as light applied for irradiation. The thin film transistor process was carried out in the same manner as in Example 2 except for this condition. The energy density of the laser applied for irradiation was 250 $mJ/cm^2$, and the irradiation time was 20 nsec.

EXAMPLE 10

An Nd—YAIG laser (wavelength: 1068 nm) was used as light applied for irradiation. The thin film transistor process was carried out in the same manner as in Example 2 except for this condition. The energy density of laser applied for irradiation was 400 $mJ/cm^2$, and the irradiation time was 20 nsec.

EXAMPLE 11

As an object-of-transfer layer, a polysilicon thin film transistor layer formed through high-temperature processing at 1000° C. (film thickness: 80 nm) was used. The thin film transistor process was carried out in the same manner as in Example 1 except for this condition.

EXAMPLE 12

As a destination-of-transfer part, a transparent substrate made of polycarbonate (glass transition temperature: 130° C.) was used. The thin film transistor process was carried out in the same manner as in Example 1 except for this condition.

EXAMPLE 13

As a destination-of-transfer part, a transparent substrate made of AS resin (glass transition temperature: 70 to 90° C.) was used. The thin film transistor process was carried out in the same manner as in Example 2 except for this condition.

EXAMPLE 14

As a destination-of-transfer part, a transparent substrate made of polymethylmethacrylate (glass transition temperature: 70 to 90° C.) was used. The thin film transistor process was carried out in the same manner as in Example 3 except for this condition.

EXAMPLE 15

As a destination-of-transfer part, a transparent substrate made of polyethylene terephthalate (glass transition temperature: 67° C.) was used. The thin film transistor process was carried out in the same manner as in Example 5 except for this condition.

EXAMPLE 16

As a destination-of-transfer part, a transparent substrate made of high density polyethylene (glass transition temperature: 77 to 90° C.) was used. The thin film transistor process was carried out in the same manner as in Example 6 except for this condition.

EXAMPLE 17

As a destination-of-transfer part, a transparent substrate made of polyamide (glass transition temperature: 145° C.) was used. The thin film transistor process was carried out in the same manner as in Example 9 except for this condition.

EXAMPLE 18

As a destination-of-transfer part, a transparent substrate made of epoxy resin (glass transition temperature: 120° C.) was used. The thin film transistor process was carried out in the same manner as that in Example 10 except this condition.

EXAMPLE 19

As a destination-of-transfer part, a transparent substrate made of polymethylmethacrylate (glass transition temperature: 70 to 90° C.) was used. The thin film transistor process was carried out in the same manner as in Example 11 except for this condition.

In Examples 1 to 19, the transferred thin film transistors were examined through macroscopic and microscopic observations. The results of examinations in these examples revealed that uniform transference was accomplished without defect and unevenness.

As described hereinabove and according to the thin film device transfer technique of the present invention, it is possible to secondarily transfer thin film devices (object-of-transfer layer) to a variety of destination-of-transfer parts while maintaining the layering relationship of the thin film devices with respect to a substrate employed for thin film device formation. For instance, using the thin film device transfer technique of the present invention, thin film devices can be mounted on a part made of a material which does not permit direct formation of a thin film thereon, a material not suitable for thin film formation, an easy-to-mold material or an inexpensive material. With the thin film transfer technique of the present invention, thin film devices can also be mounted on a large-sized part which does not easily disintegrate.

In particular, it is possible to use a destination-of-transfer part made of a material which is inferior to an ordinary thin film device substrate material in such characteristics as heat resistance and corrosion resistance, e.g., any synthetic resin or glass material having a low melting point. According to the present invention, in fabrication of a liquid crystal display comprising thin film transistors (polysilicon TFTS in particular) for example, a heat-resistant quartz glass material may be used as a substrate for thin film device formation, and a transparent substrate made of an inexpensive easy-to-shape material such as a synthetic resin or glass material having a low melting point may be used as a destination-of-transfer part. Thus, a large-sized inexpensive liquid crystal display can be manufactured with ease. It is to be understood that such an advantageous feature of the present invention is not limited in its application to fabrication of a liquid crystal display and may be applied to the fabrication of other kinds of devices.

Further, having the above-mentioned advantages, the thin film device transfer technique of the present invention makes it possible to form and pattern a functional thin film device layer (object-of-transfer layer) on a highly reliable substrate such as a heat-resistant quartz glass substrate. Regardless of material characteristics and properties of a destination-of-transfer part, highly reliable functional thin film devices can therefore be mounted on the destination-of-transfer part according to the present invention.

Furthermore, although such a highly reliable substrate is expensive, it may be recycled to reduce manufacturing costs.

Still further, as described above and according to one aspect of the present invention, an object-of-transfer layer having a shape retaining property can be transferred from a substrate employed for its formation to a destination-of-transfer part using only one separation layer and one destination-of-transfer part instead of combined use of first and second separation layers and primary and secondary destination-of-transfer parts. For the purpose of providing the object-of-transfer layer with a shape retaining property, the thickness of an insulation layer for thin film devices may be increased or a reinforcing layer may be formed thereon.

What is claimed is:

1. A method for making a circuit, comprising:
   a first step of forming a first separation layer on a substrate;
   a second step of forming an object-of-transfer layer including a device on said first separation layer;
   a third step of forming a second separation layer on said object-of-transfer layer;
   a fourth step of attaching a primary destination-of-transfer part to said second separation layer;
   a fifth step of causing exfoliation in an inner-layer and/or interface of said first separation layer, and then removing said substrate from said object-of-transfer layer while retaining at least part of said first separation layer on said object-of-transfer layer using said first separation layer as a boundary;
   a sixth step of removing said first separation layer from said object-of-transfer layer;
   a seventh step of attaching a secondary destination-of-transfer part to the bottom of said object-of-transfer layer; and
   an eighth step of removing said primary destination-of-transfer part and said second separation layer from said object-of-transfer layer,
   wherein said circuit includes said object-of-transfer layer including the device transferred to said secondary destination-of-transfer part.

2. The method as defined in claim 1, wherein:
   said second separation layer is made of an adhesive material; and
   said eighth step includes a step of melting said adhesive material.

3. The method as defined in claim 1, wherein said second step includes a step of forming an electrode for conduction of said device after formation of said device.

4. The method as defined in claim 1, wherein said secondary destination-of-transfer part is made of a material having a glass transition temperature (Tg) of softening point which is lower than or equal to a maximum temperature $T_{max}$ used in formation of said object-of-transfer layer.

5. The method as defined in claim 1, wherein said secondary destination-of-transfer part has a glass transition temperature (Tg) or softening point which is lower than or equal to a maximum temperature used in formation of said device.

6. The method as defined in claim 1, wherein said secondary destination-of-transfer part is made of a synthetic resin or glass material.

7. The method as defined in claim 1, wherein said substrate is made of a material having a distortion point which is higher than or equal to a maximum temperature $T_{max}$ used in formation of said object-of-transfer layer.

8. The method as defined in claim 1, wherein said device includes a thin film transistor (TFT).

9. A method for making a circuit, comprising:

a first step of forming a first separation layer on a substrate;

a second step of forming an object-of-transfer layer including a device on said first separation layer;

a third step of forming a second separation layer on said object-of-transfer layer;

a fourth step of attaching a primary destination-of-transfer part to said second separation layer;

a fifth step of causing exfoliation in an inner-layer and/or interface of said first separation layer, and then removing said substrate from said object-of-transfer layer while retaining at least part of said first separation layer on said object-of-transfer layer;

a sixth step of removing said first separation layer from said object-of-transfer layer;

a seventh step of attaching a secondary destination-of-transfer part which is larger than said substrate to the bottom of said object-of-transfer layer; and an eighth step of removing said primary destination-of-transfer part and said second separation layer from said object-of-transfer layer, wherein a plurality of said object-of-transfer layers are transferred to said secondary destination-of-transfer part by repeating said first to eighth steps a plural number of times, and wherein said circuit includes said plurality of object-of-transfer layers each including the device.

10. The method for making a circuit as defined in claim 1, wherein in the fifth step, the exfoliation is induced by light irradiation.

11. An electronic apparatus comprising the circuit manufactured by using the method as defined in claim 1.

12. An electronic apparatus comprising a circuit manufactured by using the method as defined in claim 9.

13. A method for making an active matrix substrate, comprising:

a first step of forming a first separation layer on a substrate;

a second step of forming an object-of-transfer layer including a device above a substrate on said first separation layer;

a third step of forming a second separation layer on said object-of-transfer layer;

a fourth step of attaching a primary destination-of-transfer part to said separation layer;

a fifth step of causing exfoliation in an inner-layer and/or interface of said first separation layer, and then removing said substrate from said object-of-transfer layer while retaining at least a part of said first separation layer on said object-of-transfer layer;

a sixth step of removing said first separation layer from said object-of-transfer layer;

a seventh step of attaching a secondary destination-of-transfer part to the bottom of said object-of-transfer layer; and an eighth step of removing said primary destination-of-transfer part and said second separation layer from said object-of-transfer layer, wherein said active matrix substrate includes said object-of-transfer layer including the device transferred to said secondary destination-of-transfer part.

14. A liquid crystal device comprising the active matrix substrate manufactured by using the method as defined in claim 13.

15. A method for making an active matrix substrate, comprising:

a first step of forming a first separation layer on a substrate;

a second step of forming an object-of-transfer layer including a device above a substrate on said first separation layer;

a third step of forming a second separation layer on said object-of-transfer layer;

a fourth step of attaching a primary destination-of-transfer part to said separation layer;

a fifth step of causing exfoliation in an inner-layer and/or interface of said first separation layer, and then removing said substrate from said object-of-transfer layer while retaining at least a part of said first separation layer on said object-of-transfer layer;

a sixth step of removing said first separation layer from said object-of-transfer layer;

a seventh step of attaching a secondary destination-of-transfer part to the bottom of said object-of-transfer layer; and an eighth step of removing said primary destination-of-transfer part and said second separation layer from said object-of-transfer layer, wherein a plurality of said object-of-transfer layers are transferred to said secondary destination-of-transfer part by repeating said first to eighth steps a plural number of times, and wherein said active matrix substrate includes said plurality of object-of-transfer layers each including the device.

16. A liquid crystal device comprising the active matrix substrate manufactured by using the method as defined in claim 15.

* * * * *